US007053608B2

(12) United States Patent
Friend et al.

(10) Patent No.: US 7,053,608 B2
(45) Date of Patent: May 30, 2006

(54) MAGNETOMETER HAVING A DYNAMICALLY ADJUSTABLE BIAS SETTING AND ELECTRONIC VEHICLE COMPASS INCORPORATING THE SAME

(75) Inventors: Timothy R. Friend, Grandville, MI (US); Jon H. Bechtel, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 289 days.

(21) Appl. No.: 10/685,635

(22) Filed: Oct. 15, 2003

(65) Prior Publication Data

US 2004/0080316 A1 Apr. 29, 2004

Related U.S. Application Data

(62) Division of application No. 09/989,559, filed on Nov. 20, 2001, now Pat. No. 6,653,831.

(51) Int. Cl.
*G01R 33/04* (2006.01)
(52) U.S. Cl. .......................... 324/244; 324/253; 33/361
(58) Field of Classification Search ................ 324/244, 324/202, 247, 249, 253, 258, 260; 33/361, 33/319
See application file for complete search history.

(56) References Cited

U.S. PATENT DOCUMENTS

| 1,047,157 A | * | 12/1912 | Bliss |
| 1,472,342 A | * | 10/1923 | Pickard |
| 1,774,458 A | * | 8/1930 | Tear |
| 1,863,415 A | * | 6/1932 | Rieber |
| 1,886,336 A | * | 11/1932 | Gunn |
| 1,968,542 A | * | 7/1934 | Tear |
| 1,996,906 A | * | 4/1935 | Lanty |
| 2,047,609 A | * | 7/1936 | Antranikian |
| 2,204,292 A | * | 6/1940 | Barth |
| 2,241,499 A | * | 5/1941 | Barth |
| 2,252,059 A | * | 8/1941 | Barth |
| 2,261,309 A | * | 11/1941 | Stuart, Jr. |

(Continued)

FOREIGN PATENT DOCUMENTS

EP 0045509 * 12/1985

OTHER PUBLICATIONS

S. Takeuchi et al., "A Resonant-Type Amorphous Ribbon Magnetometer Driven by an Operational Amplifier," IEEE Transactions on Magnetics, vol. MAG-20, No. 5, Sep. 1984.

(Continued)

*Primary Examiner*—Jay M. Patidar
(74) *Attorney, Agent, or Firm*—Price, Heneveld, Cooper, DeWitt & Litton, LLP

(57) ABSTRACT

According to some embodiments of the present invention, a magnetometer includes at least one sensor for sensing a magnetic field component, a biasing circuit, and a processor. The sensor generates an output signal having a signal characteristic that varies in response to the sensed magnetic field component and in response to an applied bias. The biasing circuit dynamically biases the sensor in response to a bias setting signal. The processor is coupled to receive the output signal from the sensor and coupled to the biasing circuit. The processor is operable to generate the bias setting signal and thereby control the biasing circuit to dynamically bias the sensor such that the signal characteristic of the output signal is maintained in a target range. The processor determines the magnetic field component sensed by the sensor as a function of the bias setting applied to the sensor.

41 Claims, 11 Drawing Sheets

U.S. PATENT DOCUMENTS

| | | | |
|---|---|---|---|
| 2,357,319 | A * | 9/1944 | Esval et al. |
| 2,373,096 | A * | 4/1945 | Bonell |
| 2,383,461 | A * | 8/1945 | Esval et al. |
| 2,387,496 | A * | 10/1945 | Cornelius |
| 2,393,670 | A * | 1/1946 | White |
| 2,407,536 | A * | 9/1946 | Chapman |
| 2,432,514 | A | 12/1947 | Depp et al. |
| 2,459,830 | A | 1/1949 | McCarthy |
| 2,464,057 | A | 3/1949 | Phair |
| 2,466,687 | A | 4/1949 | Craddock et al. |
| 2,480,265 | A | 8/1949 | Rubenstein |
| 2,528,703 | A | 11/1950 | Muffly |
| 2,591,406 | A | 4/1952 | Carter et al. |
| 2,597,125 | A | 5/1952 | Noxon |
| 2,597,135 | A | 5/1952 | Stuart, Jr. |
| 2,671,275 | A | 3/1954 | Burns, Jr. |
| 2,837,644 | A | 6/1958 | Shallon |
| 2,854,580 | A | 9/1958 | Uchrin et al. |
| 2,912,653 | A | 11/1959 | Tillman |
| 2,943,306 | A | 6/1960 | Gray et al. |
| 2,963,658 | A | 12/1960 | Rochelle |
| 2,991,414 | A | 7/1961 | Tillman |
| 3,040,247 | A | 6/1962 | Van Allen |
| 3,135,199 | A | 6/1964 | Brown |
| 3,179,786 | A | 4/1965 | Greene |
| 3,197,880 | A | 8/1965 | Rice et al. |
| 3,210,689 | A | 10/1965 | Burwen |
| 3,239,754 | A | 3/1966 | Odom, Jr. et al. |
| 3,242,269 | A | 3/1966 | Pettengill |
| 3,271,665 | A | 9/1966 | Castro et al. |
| 3,281,670 | A | 10/1966 | Myers et al. |
| 3,346,807 | A | 10/1967 | Wood et al. |
| 3,356,963 | A | 12/1967 | Buck |
| 3,400,328 | A | 9/1968 | Penn et al. |
| 3,416,072 | A | 12/1968 | Fussell et al. |
| 3,443,213 | A | 5/1969 | Bader et al. |
| 3,461,382 | A | 8/1969 | Anderson |
| 3,568,052 | A | 3/1971 | Anderson |
| 3,584,388 | A | 6/1971 | Petrov et al. |
| 3,732,443 | A | 5/1973 | Lovrenich |
| 3,768,011 | A | 10/1973 | Swain |
| 3,812,428 | A | 5/1974 | Trenkler |
| 3,829,894 | A | 8/1974 | Watanabe et al. |
| 3,936,949 | A | 2/1976 | Devaud |
| 3,973,191 | A | 8/1976 | Zabler |
| 4,007,417 | A | 2/1977 | Takeuchi et al. |
| 4,053,849 | A | 10/1977 | Bower et al. |
| 4,182,987 | A | 1/1980 | Moeller |
| 4,241,317 | A | 12/1980 | Breitling |
| 4,290,018 | A | 9/1981 | Rhodes |
| 4,305,034 | A | 12/1981 | Long et al. |
| 4,314,200 | A | 2/1982 | Marek |
| 4,403,515 | A | 9/1983 | Iwasaki |
| 4,675,615 | A | 6/1987 | Bramanti |
| 4,728,888 | A | 3/1988 | Bauer et al. |
| 4,733,181 | A | 3/1988 | Bauer |
| 4,851,775 | A | 7/1989 | Kim et al. |
| 4,918,824 | A | 4/1990 | Farrar |
| 5,039,945 | A | 8/1991 | Webb |
| 5,239,264 | A | 8/1993 | Hawks |
| 5,560,115 | A | 10/1996 | Fowler |
| 5,608,320 | A | 3/1997 | Dinsmore et al. |
| 6,084,406 | A | 7/2000 | James et al. |
| 6,349,116 | B1 * | 2/2002 | Hash et al. ............... 375/258 |
| 6,512,370 | B1 | 1/2003 | James |
| 6,513,252 | B1 | 2/2003 | Schierbeek et al. |

OTHER PUBLICATIONS

K. Shirae, "Noise in Amorphous Magnetic Materials," IEEE Transactions on Magnetics, vol. MAG-20, No. 5, Sep. 1984.

K. Mohri, "Review on Recent Advances in the Field of Amorphous," IEEE Transactions on Magnetics, vol. MAG-20, No. 5, Sep. 1984.

B.B. Narod et al., "An Evaluation of the Noise Performance of Fe, Co, Si, and B Amorphous Alloys in Ring-core Fluxgate Magnetometers," Can. J. Phys., 1985.

* cited by examiner

MAGNETOMETER HAVING A DYNAMICALLY ADJUSTABLE BIAS SETTING AND ELECTRONIC VEHICLE COMPASS INCORPORATING THE SAME

CROSS-REFERENCE TO RELATED APPLICATIONS

This application is a divisional of U.S. patent application Ser. No. 09/989,559, filed Nov. 20, 2001, now U.S. Pat. No. 6,653,831, the entire disclosure of which is incorporated herein by reference.

BACKGROUND OF THE INVENTION

The present invention generally relates to a magnetometer and more specifically relates to an electronic compass for use in a vehicle.

Magnetometers are used in many different applications. One such application is an electronic compass for a vehicle. In such electronic compasses, magnetometers are utilized to ascertain the vehicle heading relative to the Earth's magnetic north pole. A typical electronic compass includes two magnetic field sensors both disposed with their axes lying in a horizontal plane with a first sensor having its axis aligned in parallel with the longitudinal axis of the vehicle and the second sensor having its axis disposed orthogonal to the axis of the first sensor. The sensors are then utilized to detect the magnitude of orthogonal, horizontal, axially aligned components of the Earth's magnetic field vector such that a processing circuit may then compute the heading of the vehicle relative to the Earth's magnetic field vector.

Several different forms of magnetometers have been utilized for use in vehicle electronic compasses. Examples of some of these types of magnetometers include those utilizing flux-gate sensors, magneto-resistive sensors, and magneto-inductive sensors. Magneto-inductive sensors may be configured in different forms including L/R sensors and LC sensors. In both these forms of magneto-inductive sensors, a coil is wound around a core material. The sensor has a characteristic that its inductance varies linearly in response to a magnetic field, but only throughout two predetermined ranges of values of the external magnetic field. By viewing a plot of the sensor inductance versus the magnetic field strength (see FIG. 5, for example), one can see that the resultant curve is substantially symmetric about the point at which the magnetic field strength is zero. Accordingly, it is commonplace to apply a bias current to the sensor coil such that an artificial magnetic field is generated about the core material. The artificially generated magnetic field produced by this bias current is summed with the external magnetic field. External magnetic fields that are in the same direction as the artificial magnetic field generated by the bias current add to one another while an external magnetic field in the opposite direction of the artificial magnetic field is subtracted from the artificial magnetic field. Thus, by measuring the change in inductance of the sensor, the strength of the axially aligned magnetic field component may be ascertained.

To measure the inductance change of the sensor, circuit configurations where the responding frequency changes with changing sensor inductances have been employed. With such circuits, the changes in inductance of the sensor produces approximately proportional changes in the frequency of the signal output from the sensor. The frequency change may then be measured to determine the strength of the external magnetic field.

A problem encountered in such magnetometers is that the core material characteristics vary with temperature and age. One solution to this problem is disclosed in European Patent No. 0045509 B1. This European patent discloses that the bias current polarity on the sensor coil may be reversed with measurements taken with the bias current at both polarities such that the difference between the two measurements corresponds to the external magnetic field. The measurement thus taken is independent of any variance of the core material caused by temperature variation or age.

U.S. Pat. No. 5,239,264 discloses a similar technique. FIGS. 1 and 2 of this application correspond to FIGS. 3 and 4 of the '264 patent. As shown in FIGS. 1 and 2, the permeability function u(H) of the core material varies as a function of the strength of the magnetic field H over a particular range of the magnetic field strength. As apparent from this graph, there are generally two regions of the curve in which the permeability varies with respect to the change in magnetic field strength. One of these regions has a positive slope whereas the other region has a negative slope. In the '264 patent, the polarity of the DC bias current is alternatingly reversed so as to provide readings at both polarities. The two readings may then be subtracted from one another to arrive at the magnetic field strength of the component of the Earth's magnetic field sensed by that particular sensor coil.

In both the above-mentioned U.S. Pat. No. 5,239,264 and published European Patent No. 0045509 B1, the DC bias current remains at a constant level and only the polarity of the bias current is reversed. One problem with providing an electronic compass in an automobile is that the automobile may distort the external magnetic field. Further, as the vehicle travels past objects such as bridges, subways, power lines, railroad tracks, and other objects, these objects may cause disturbances in the magnetic field that are sensed by the electronic compass. Such magnetic field disturbances may produce magnetic fields that cause the magnetic field sensed by the sensor coils to fall within a non-linear region of the inductance versus magnetic field strength curve. Thus, the magnetometers of the above-described patents have limited ranges in which they can accurately detect the strength of the external magnetic field.

Accordingly, there exists a need for an electronic compass having the ability to accurately sense magnetic field components throughout a greater range than is presently provided by conventional magnetometers.

SUMMARY OF THE INVENTION

According to one embodiment of the present invention, a magnetometer is provided that comprises a sensor for sensing a magnetic field, a biasing circuit, and a processor. The sensor generates an output signal having a signal characteristic that varies in response to the sensed magnetic field and in response to an applied bias. The biasing circuit dynamically biases the sensor in response to a bias setting signal. The processor is coupled to receive the output signal from the sensor and coupled to the biasing circuit. The processor is operable to generate the bias setting signal and thereby control the biasing circuit to dynamically bias the sensor such that the signal characteristic of the output signal is maintained within a relatively small target range of levels. The processor determines the magnetic field component sensed by the sensor as a function of the bias setting applied to the sensor.

According to another embodiment of the present invention, a magnetometer is provided that comprises a first sensor for sensing a first component of a magnetic field, a second sensor for sensing a second component of the magnetic field, a biasing circuit, and a processor. Each of the sensors generates an output signal having a frequency that varies in response to the sensed component magnetic field and in response to an applied bias current. The biasing circuit generates bias currents to dynamically bias the first and second sensors. The processor is coupled to receive the output signals from the sensors and is coupled to the biasing circuit. The processor is operable to control the biasing circuit to dynamically vary the bias currents applied to the sensors such that the frequency of the output signals is maintained within one or more target frequency ranges. The processor determines the magnetic field components sensed by the sensors as a function of the biasing currents applied to the sensors.

According to another embodiment, an electronic compass for a vehicle is provided that comprises a first magnetic field sensor for sensing a first component of a magnetic field, a second magnetic field sensor for sensing a second component of the magnetic field that is orthogonal to the first component, a biasing circuit, a processing circuit, and a heading indicator coupled to the processing circuit for indicating the vehicle heading. Each of the sensors generates an output signal having a signal characteristic that varies in response to both the sensed component magnetic field and in response to an applied bias current. The biasing circuit generates bias currents to dynamically bias the first and second sensors. The processing circuit is coupled to receive the output signals from the sensors and is coupled to the biasing circuit. The processor is operable to control the biasing circuit to dynamically vary the bias currents applied to the sensors such that the signal characteristics of the output signals are maintained within one or more target ranges. The processing circuit computes a vehicle heading as a function of the biasing currents applied to the sensors.

According to another embodiment, a method of determining the strength of a magnetic field component comprises the steps of: providing a magnetic field sensor that generates an output signal having a signal characteristic that varies in response to the strength of a sensed magnetic field component and in response to an applied bias setting; dynamically varying a bias setting of the sensor such that the signal characteristic of the output signal is maintained within a target range; and determining the strength of the sensed magnetic field component as a function of the bias setting of the sensor.

According to another embodiment, a magnetometer is provided that comprises a sensor for sensing a magnetic field component, a magnetic field generating mechanism, and a processor coupled to receive the output signal from the sensor and coupled to the magnetic field generating mechanism. The sensor generates an output signal having a characteristic that varies substantially linearly in response to the sensed magnetic field components throughout a first range of magnetic field levels. The magnetic field component varies throughout a second range of magnetic field levels. The magnetic field generating mechanism generates a magnetic field that is summed with any external magnetic field such that the resultant magnetic field is sensed by the sensor. The strength of the generated magnetic field is selectively variable. The processor is operable to control the magnetic field generating mechanism to select the field strength of the generated magnetic field and thereby dynamically shift and/or maintain the second range within the first range. The processor is further operable to determine the magnetic field component sensed by the sensor in response to the output signal received from the sensor.

According to another embodiment, a magnetometer is provided that comprises a sensing element having a sensor characteristic that varies in response to a magnetic field, and an amplifier having an input for receiving a driving signal. The sensing element is coupled within a feedback loop of the amplifier. The amplifier generates an output signal having a signal characteristic that varies at least partially in response to variance in the sensor characteristic.

According to another embodiment, a magnetometer comprises a first sensing element having a sensor characteristic that varies in response to a magnetic field; a second sensing element having a sensor characteristic that varies in response to a magnetic field; a single first analog switch provided for selecting the first sensing element; a single second analog switch provided for selecting the second sensing element; and a processor coupled to receive output signals from a selected one of the first and second sensing elements and coupled to the first and second analog switches to select one of the first and second sensing elements.

According to another embodiment, a magnetometer comprises a sensor for sensing a magnetic field, the sensor generating an output signal having a signal characteristic that varies in response to the sensed magnetic field and in response to an applied bias; first and second high gain amplifiers each having an input, one of the amplifiers being coupled to the sensor; a biasing circuit for biasing the sensor, the biasing circuit being coupled between the inputs of the first and second high gain amplifiers; and a processor coupled to receive the output signal from the sensor, the processor determines the magnetic field component sensed by the sensor.

According to another embodiment, a magnetometer comprises a resonant sensor for sensing a magnetic field, the sensor generating an output signal having a signal characteristic that varies in response to the sensed magnetic field and in response to an applied bias; a biasing circuit for adjustably biasing the sensor at two or more bias levels for each bias polarity; and a processor coupled to receive the output signal from the sensor, the processor determines the magnetic field component sensed by the sensor, wherein the peak to peak excursion of the magnetic field level in the resonant sensor during a resonant cycle is a fraction of the field level excursion range due to the adjustment of the bias circuit over its total range of adjustment.

According to another embodiment, a magnetometer comprises a resonant sensor for sensing a magnetic field, the sensor generating an output signal having a signal characteristic that varies in response to the sensed magnetic field; and a processor coupled to receive the output signal from the sensor, the processor determines the magnetic field component sensed by the sensor, wherein the peak to peak excursion of the magnetic field level in the resonant sensor during a resonant cycle is less than the total range of the magnetic field to be measured.

According to another embodiment, a magnetometer comprises a resonant sensor for sensing a magnetic field, the sensor generating an output signal having a signal characteristic that varies in response to the sensed magnetic field; an excitation circuit coupled to the resonant sensor for supplying an excitation signal thereto, the excitation circuit limits the amplitude of the excitation signal to prevent significant saturation of the response of the resonant sensor to the excitation signal; and a processor coupled to receive the output signal from the sensor, the processor determines the magnetic field component sensed by the sensor.

According to another embodiment, a magnetometer comprises a sensor for sensing a magnetic field, the sensor generating an output signal having a signal characteristic that varies in response to the sensed magnetic field and in response to an applied bias; a biasing circuit for adjustably biasing the sensor at two or more bias levels; and a processor coupled to receive the output signal from the sensor, the processor determines the magnetic field component sensed by the sensor as a function of the signal characteristic of the output signal from the sensor and as a function of a slope of the output signal versus bias level.

According to another embodiment, a magnetometer comprises a sensor for sensing a magnetic field, the sensor generating an output signal having a signal characteristic that varies in response to the sensed magnetic field and in response to an applied bias; a biasing circuit for adjustably biasing the sensor to at least a first bias level and a second bias level; and a processor coupled to receive the output signal from the sensor, the processor determines the magnetic field component sensed by the sensor as a function of an average of the output signal level when at the first and second bias levels.

According to another embodiment, a magnetometer comprises a first sensing element having a sensor characteristic that varies in response to a magnetic field; a second sensing element having a sensor characteristic that varies in response to a magnetic field; a biasing circuit for adjustably biasing the first sensing element to at least a first bias level and a second bias level, and for adjustably biasing the second sensing element to at least a third bias level and a fourth bias level; and a processor coupled to the biasing circuit and to the first and second sensing elements to receive the output signals from the sensing elements. The processor measures the magnetic field components sensed by the sensing elements by sequentially: sampling the output signal of the first sensing element at the first bias level, sampling the output signal of the second sensing element at the third bias level, sampling the output signal of the second sensing element at the fourth bias level, sampling the output signal of the first sensing element at the second bias level, determining the magnetic field component of the first sensing element as a function of the samples taken at the first and second bias levels, and determining the magnetic field component of the second sensing element as a function of the samples taken at the third and fourth bias levels.

According to another embodiment, a magnetometer comprises a first sensing element having a sensor characteristic that varies in response to a magnetic field; a second sensing element having a sensor characteristic that varies in response to a magnetic field; at least one analog switch provided for selecting the first or second sensing element, the at least one analog switch having a resistance; a biasing circuit for supplying a biasing current to a selected one of the sensing elements; and a processor coupled to receive output signals from a selected one of the first and second sensing elements and coupled to the at least one analog switch to select one of the first and second sensing elements, the processor determines the magnetic field components sensed by the sensing elements, wherein the biasing circuit is configured to supply a biasing current that is substantially independent of the resistance of the at least one analog switch.

According to another embodiment, a magnetometer comprises a first sensing element having a sensor characteristic that varies in response to a magnetic field; a second sensing element having a sensor characteristic that varies in response to a magnetic field; at least one analog switch provided for selecting the first or second sensing; a biasing circuit for adjustably biasing the sensing elements to at least a first bias level and a second bias level; and a processor coupled to receive output signals from a selected one of the first and second sensing elements and coupled to the at least one analog switch to select one of the first and second sensing elements, the processor determines the magnetic field components sensed by the sensing elements, wherein the biasing circuit biases one of the sensing elements at the first bias level and subsequently biases the same sensing element at the second bias level without any analog switch changing states.

According to another embodiment, a magnetometer comprises a sensor for sensing a magnetic field, the sensor generating an output signal having a signal characteristic that varies in response to the sensed magnetic field and in response to an applied bias; a biasing circuit for adjustably biasing the sensor, the biasing circuit including a digital-to-analog converter; and a processing circuit including a readout device coupled to receive the output signal from the sensor, the processing circuit measures the magnetic field component sensed by the sensor by taking at least one reading of the output signal from the sensor, wherein the resolution in reading the output signal is a function of both the digital-to-analog converter and the readout device.

According to another embodiment, a method of making a plurality of magnetic field sensing inductors comprises the sequentially performed steps of: providing a core for each field sensing inductor; testing the core of each field sensing inductor; and winding a coil around each core, the number of windings about each core being adjusted based on the results of testing of the core.

According to another embodiment, a magnetometer comprises a resonant sensor for sensing a magnetic field, the sensor generating an output signal having a signal characteristic that varies in response to the sensed magnetic field; an excitation circuit coupled to the resonant sensor for supplying an excitation signal thereto having an AC component; a filter for filtering the excitation signal prior to application to the resonant sensor, the filter making the excitation signal approximately sinusoidal; and a processor coupled to receive the output signal from the sensor, the processor determines the magnetic field component sensed by the sensor.

According to another embodiment, a magnetometer comprises a sensor for sensing a magnetic field, the sensor generating an output signal having a signal characteristic that varies in response to the sensed magnetic field and in response to an applied bias current; a biasing circuit for adjusting a bias current supplied to the sensor in response to a bias setting; and a processor coupled to receive the output signal from the sensor and coupled to the biasing circuit for supplying the bias setting, the processor determines the magnetic field component sensed by the sensor as a function of the bias setting, wherein the bias setting selected to determine the magnetic field component is based on the difference in bias current at two points for which the output signal achieves a target response.

According to another embodiment, a magnetometer comprises a sensor for sensing a magnetic field, the sensor generating an output signal having a signal characteristic that varies in response to the sensed magnetic field and in response to an applied bias current; a biasing circuit for adjusting a bias current applied to the sensor in response to a bias setting; and a processor coupled to receive the output signal from the sensor and coupled to the biasing circuit for supplying the bias setting, the processor determines the magnetic field component sensed by the sensor as a function of the bias setting, wherein the bias setting selected to determine the magnetic field component is based on no more than five prior raw readings obtained from the sensor.

These and other features, advantages, and objects of the present invention will be further understood and appreciated by those skilled in the art by reference to the following specification, claims, and appended drawings.

DETAILED DESCRIPTION OF THE PREFERRED EMBODIMENTS

Figure 1:
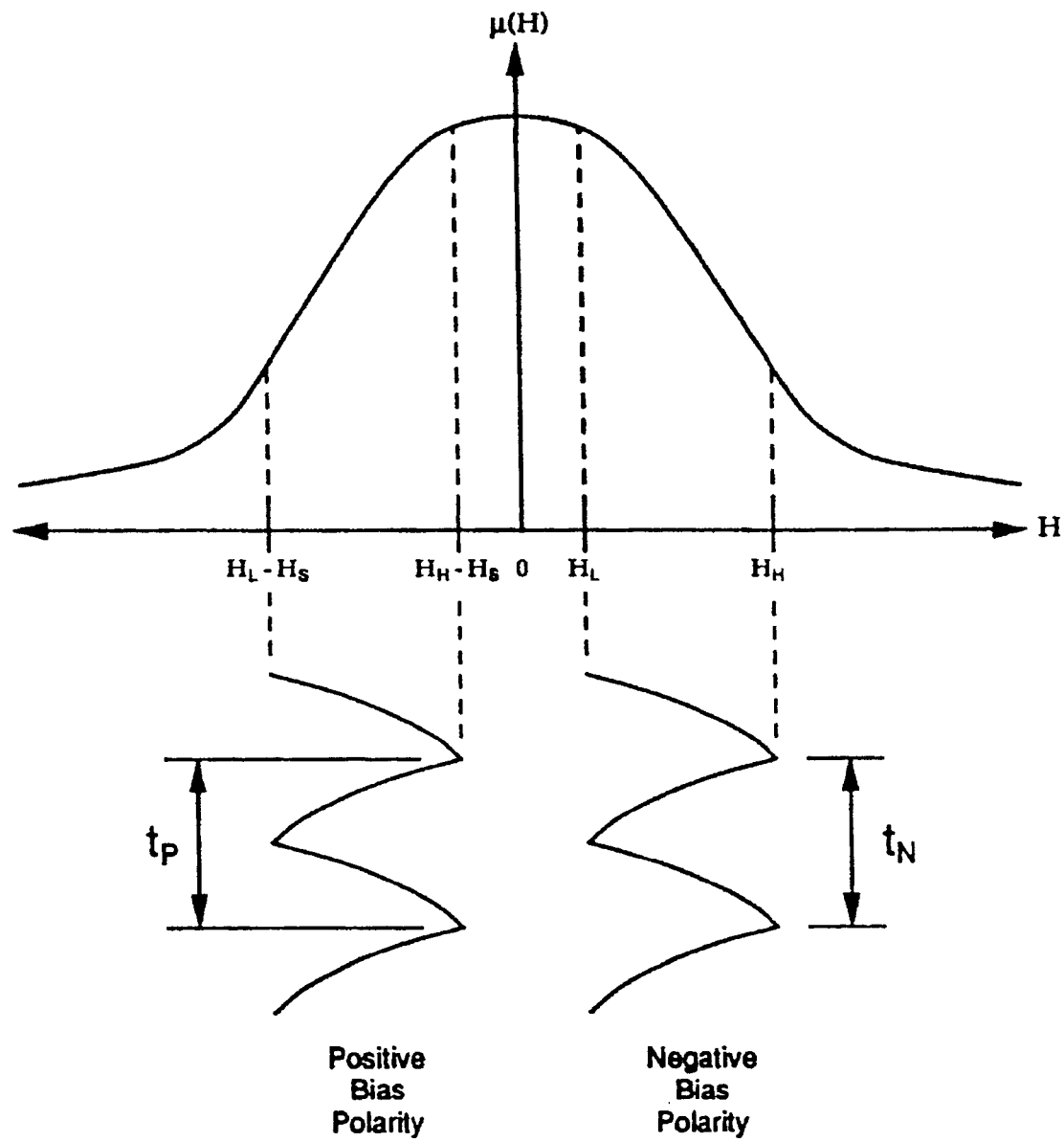
FIG. 1 is a plot of waveforms associated with a prior art magnetometer with no applied external magnetic field.
Figure 2:
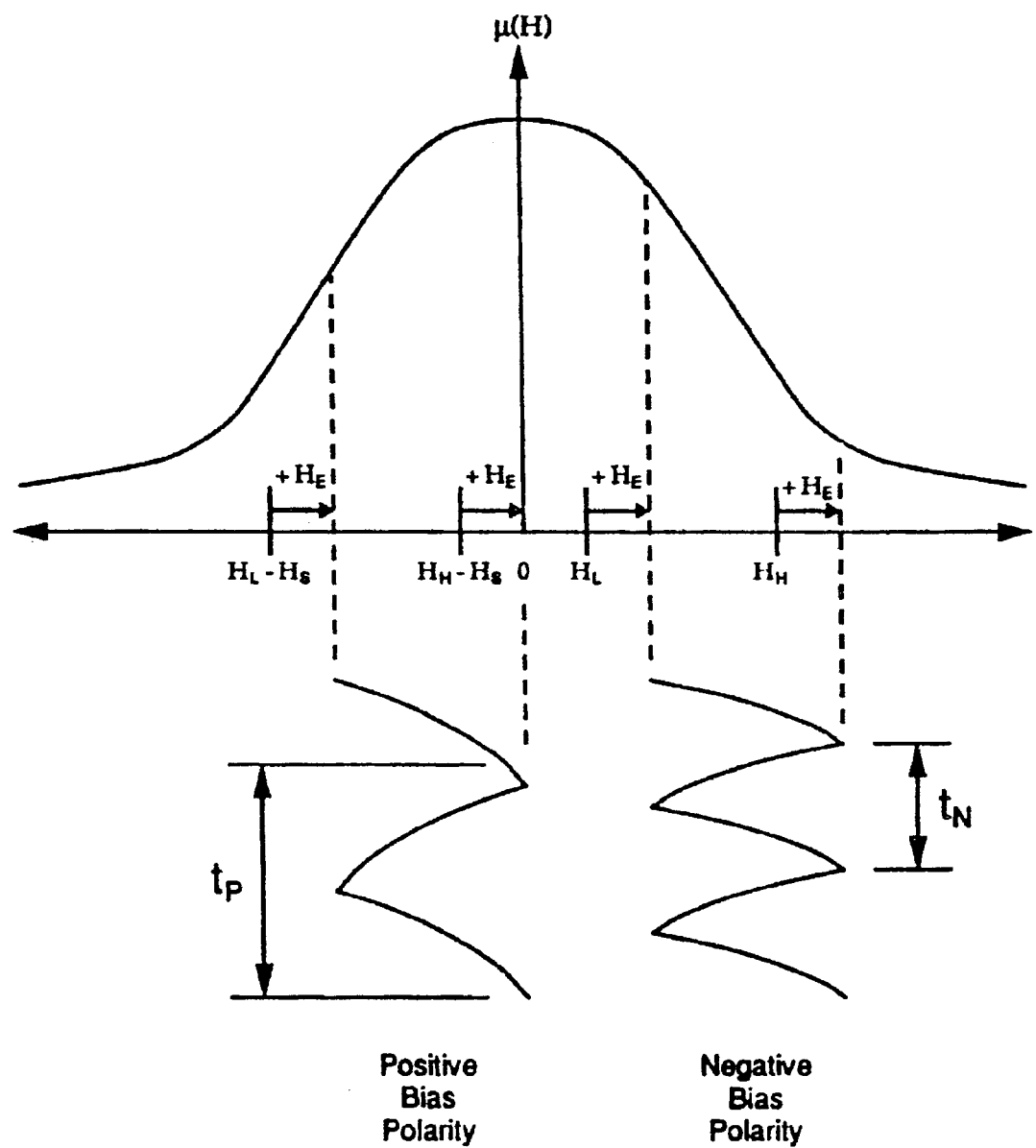
FIG. 2 is a plot of a waveform associated with a prior art magnetometer with an applied external magnetic field.

Reference will now be made in detail to the present preferred embodiments of the invention, examples of which are illustrated in the accompanying drawings. Wherever possible, the same reference numerals will be used throughout the drawings to refer to the same or like parts.

A desirable detection method for use with a magnetometer is one which operates on a modified null balance principle by which a saturable inductive sensing element is used as the sensor and a bias current is dynamically adjusted to achieve and maintain a measurable and repeatable target state of saturation in the inductive sensing element. Thus, unlike conventional magnetometers, which utilize a fixed bias current, the magnetometer of the present invention dynamically varies the bias current to maintain a characteristic of the sensor output signal in a target range while determining the relative strength of the sensed magnetic field component based upon the bias current required to maintain the output signal characteristic at the target level and on the output level within the target range. For example, if the bias current were varied to maintain the output of the sensing element in a target range of frequency or phase, the sensing element will continue to sense the magnetic field while operating in a linear portion of the sensor's inductance curve regardless of the magnitude of the magnetic field to which the sensor is exposed. Accordingly, the magnetometer of the present invention has a dramatically increased range over that of conventional magnetometers.

In the preferred embodiments described below, a single biasing circuit is provided that is adjustable through a single range to provide all of the bias settings which are used to take readings of field strength. This range is large enough to include both the capability to bias the sensor to either side of the generally symmetrical inductance versus bias current curve (i.e., in either of the target ranges) and to offset the effect of the external field in order to do so. In the preferred embodiments, two or more settings of bias are normally made for each field strength reading and these settings normally include setting of the bias to each of the two distinct ranges for which the resulting field levels in the sensing coil are approximately equal in magnitude to a chosen targeted reference value but opposite in direction. When the resulting field level is close to its targeted reference value (i.e., in the target range), the monitored output of the circuit is close to the targeted output value which corresponds to a field level equal to the reference level. In operation, a first bias setting is made with the bias level adjusted to bring the level of the resultant field in the core of the sensor close to its reference level and in the process to at least partially null or offset the combined or total effect of the field to be measured and the disturbing field in the vehicle. The circuit output which indicates the state of saturation of the sensor core is read and used to predict the first corrected bias current which would bring the biasing field and the resulting degree of saturation of the sensor core approximately to its targeted reference state. This value may optionally be expressed in units other than bias current. A second bias setting is made to bring the biasing field to the range of the other reference field value for which the direction of the reference field in the measuring core is reversed. The output which indicates the state of saturation of the core is measured in a manner similar to that used for the first bias reading and a second corrected bias is determined. The first and second corrected bias currents or related values are used to approximately determine the axially aligned component of the total external magnetic field which impinges upon the measuring coil or a functional representation thereof.

The measurable target state of saturation or pseudo null point is one for which the actual flux level for typical inductive sensors is, for example, several thousand times the minimum increment of external flux which it is desirable to detect. Suitable inductive sensing elements have one property which provides a way to sidestep many of the problems inherent in the large flux bias which is normally required for a satisfactorily detectable pseudo null point. With appropriate choice of core material, the saturation characteristics of the inductive sensing element depend mainly on the magnitude of the field in the core and are almost independent of which of the two axial directions the field assumes. Thus, to measure the component of the external field which is aligned with the sensing core, two bias levels are sequentially applied, one to reach the detectable target state of saturation with a field in one direction and the other to reach substantially the same detectable target state of saturation with a substantially equal field in the other direction. A signed average of the two resulting bias current levels is then taken and is representative of the axially aligned external magnetic field component.

When there is no external field around the coil, the currents required to reach each of the two bias states will be approximately equal in magnitude but opposite in direction so that the signed average of the two is approximately zero. When an external magnetic field is present, the axially aligned component of the external field sums as a vector quantity (or as signed numbers for fields already resolved as components along the axial direction of the inductive sensing element in one dimensional space) with the field due to the DC bias current in the coil of the inductive sensing element. Thus, it adds to the bias in one direction and subtracts from the bias in the other direction so that the result of the average is a bias current which would approximately null the axially aligned component of the external field. Thus, this value may be used as a reading of the external field strength to be measured. This technique works well, but may require very high resolution to set the bias level and perhaps an extended sequence of settings to find the bias setting which balances the external field to establish the flux level in the core which achieves the detectable target state condition. In preferred circuits, the detectable state is spread into a continuum or at least a multiple step indication of the resulting degree of saturation due to the flux level in a neighborhood of the detectable target state (i.e., target range) and a way is provided to establish a satisfactorily accurate conversion between the value of the continuous or multi-step indication and an increment of bias which when applied to the actual bias would achieve the detectable target state. When this technique is used, a biasing circuit of adequately high linearity and stability, but with reduced resolution, may be used and even then, it may not be necessary to set the bias to its closest increment in order to obtain a satisfactory reading from the multi-state indication to determine with adequate accuracy the bias which would be required to attain the targeted detectable state. The burden of high resolution may be shared between the input bias setting and the response readout enabling readings of good resolution with modest incremental resolution for the bias current setting and modest resolution for the readout.

In a first embodiment, the field sensing inductive element is incorporated into a resonant circuit and driven at a nearly constant frequency by an AC drive signal which is superimposed or summed with the DC bias current setting. The AC drive signal is preferably of low enough amplitude to prevent the driving circuit for the coil from going into saturation. In the configuration, circuit resonance is preferably at or close to the detectable target state condition. A circuit is provided to measure the phase of the response of the resonant circuit relative to the driving signal. The phase of the response relative to the driving signal has a particular value which will be referred to as the target value when the inductance of the coil is at the value chosen as the detectable target state. The phase of the response relative to the driving signal may be converted to an analog signal and a low cost microcontroller with an 8-bit pulse-width modulated D to A converter for the biasing circuit and an 8-bit A to D to read the phase of the response can serve well for this application.

In typical applications, multiple sensor elements are employed and typically selected one at a time for readout of components of a magnetic field. In such applications, it is frequently a beneficial part of the invention to choose a nested sequence of selection and readout so that, for example, with sensor elements A, B, and C, the first and second readings used for the average may be taken in an order A, B, C, C, B, A so that with appropriate timing, the first and second readings when averaged may be centered around approximately the same instant of time thereby yielding directional components of the magnetic field vector which have reduced effective time skew relative to one another.

In a second embodiment, the resonant circuit is configured as a self resonating oscillator for which bias current may be set in much the same way as for the circuit with the phase measurement output and, in this case, the detectable target state is manifest by a particular response frequency or period and the continuous or multi-step indication (i.e., target range) is a deviation in frequency or period from the targeted frequency or period. Here, a frequency counter or pulse width timer may replace the A to D converter of the first example.

Figure 3:
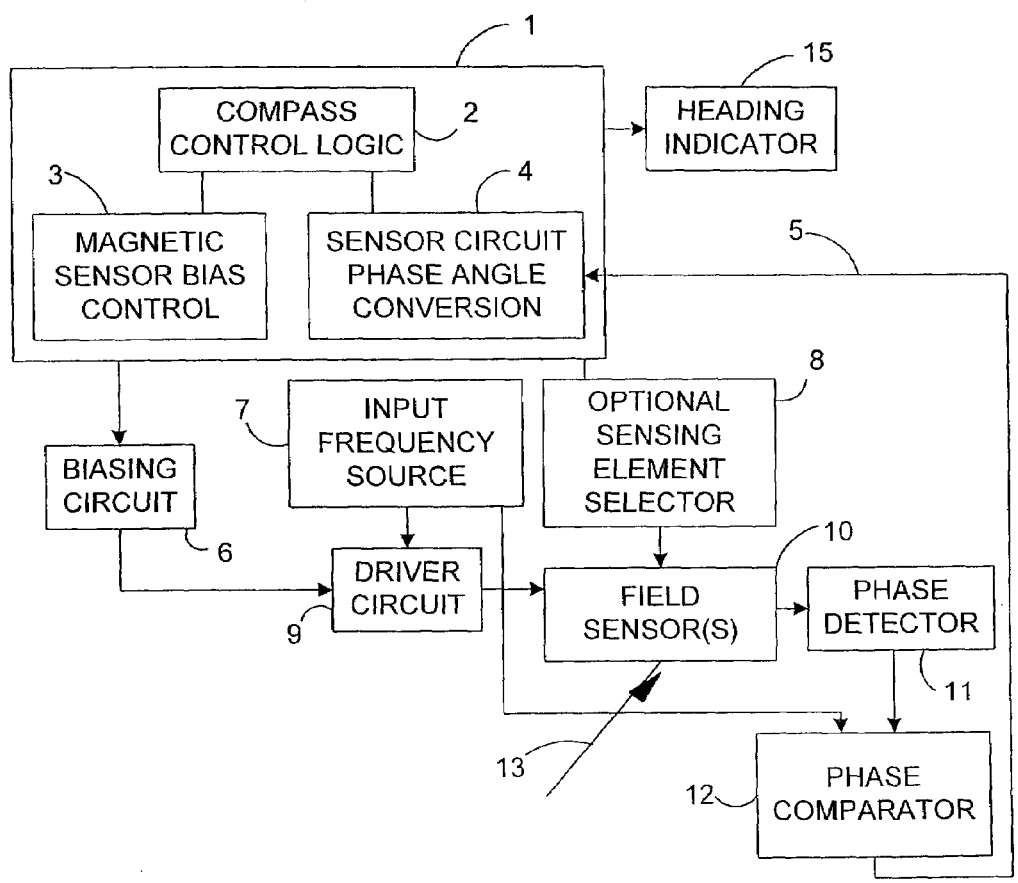
FIG. 3 is an electrical circuit diagram in block form of a magnetometer constructed in accordance with a first embodiment of the present invention.

FIG. 3 is a block diagram of a magnetometer of the first embodiment of the present invention. This magnetometer is intended primarily for, but not limited to, reading the strength and direction of the Earth's magnetic field along with disturbing fields in a vehicle in order to determine and display the heading direction of the vehicle. The magnetometer includes a microcontroller 1, a biasing circuit 6, an input frequency source 7, a sensing element selector 8, a driver circuit 9, field sensor(s) 10, a phase detector 11, and a phase comparator 12.

Microcontroller 1 contains a compass control logic 2, which includes a magnetic sensor bias control 3 and a converter 4 to read an output signal 5 from a group of field sensors 10, one of which is selected for readout by sensing element selector 8. The signal 5 is representative of the phase angle of the response of the selected sensor relative to a drive signal from the input frequency source 7. As described in more detail below with respect to FIG. 4, the magnetic field sensors 10 (typically two or three) are resonant circuits that share an amplifier 141 and each include a sensing element having an inductor. The sensing elements also include a capacitor coupled in parallel with the inductor to provide a resonating circuit. The inductor includes a coil, which is typically oriented orthogonal to the other inductor coil(s). The inductor also includes a core whose inductance changes in response to the superimposed effect of the magnetic driving force due to bias current in the inductor coil and the magnetic driving force due to the axially aligned component of the magnetic field in which the inductor coil is positioned. The superimposed effect is generally nearly equal to the vector sum of the magnetic driving force due to the bias current in the coil and the driving force of the axially aligned component of the magnetic field 13 in which the sensing element is placed. This sum will be referred to as the resultant field. The inductance of each of the sensing elements generally decreases as the magnitude of the resultant field increases, driving the high permeability core of the sensing element toward or further into saturation in the direction determined by the direction of the resultant field. Since the change in inductance with degree of saturation is normally symmetric, being primarily dependent on the magnitude of the resultant field and not on the one of the two directions that the resultant field may assume, there are normally two values of bias current which create the same inductance and, thus, the same resonant frequency in the associated resonant circuit. Depending on the core material and biasing condition, the two values of bias current for which the inductance is the same may have substantial separation from one another.

As explained above, each sensor includes a resonating circuit, which, for example, is a capacitor connected in parallel with the coil of the inductor. In some embodiments, portions of the resonating circuit may be shared by more than one sensing element.

When the resultant field is low, the resulting inductance is normally close to its highest value and the resulting resonant frequency is close to its lowest value. As the resultant field increases sufficiently in magnitude in either direction, the core is driven into partial saturation in the corresponding direction and the resonant frequency of the selected resonating circuit increases. The frequency for the input frequency source 7 is preferably selected roughly in the center of a range for which the change in resonant frequency resulting from changes in inductance with changes in the resultant field is reasonably linear (i.e., the target range). It is also desirable to choose this frequency in a range of high sensitivity in terms of being at a point of relatively high slope on the curve of resonant frequency versus resultant field for the selected resonating circuit. This frequency is preferably selected through design or measurement and maintained at this near constant value for all subsequent measurements made with the magnetometer in which it is incorporated.

The phase comparator 12 is preferably designed so that the measured phase response of the resonant circuit to the exciting frequency is nominally in the center of its range when the circuit is at resonance. It is then preferable to choose a target or reference output of the phase detector 11 which is within a range for which reliable phase response measurements may be taken and preferably close to the phase output of the circuit when the coil and associated resonating circuit are at resonance. This targeted phase output level will be referred to as the reference phase.

The cost and complexity of the circuit may in many instances be minimized by careful production control of the measuring coils including adjustment during the production process of the number of turns in the coil so that the desired properties of resonant frequency and centering in a linear range are met to a reasonable degree with a predetermined excitation frequency and resonating capacitance value. The coil production process preferably includes individualized testing of each magnetic core element and individualized adjustment of the turns on the coil in which the specific magnetic core is to be placed to meet the requirements above. The invention does not, however, preclude an option to place the frequency selection under the control of the microcontroller or other portion of the circuit; in which case, the frequency may be altered for optimal measurement for a particular condition of use of the magnetometer. For this specific embodiment of the invention, when the frequency is adjustable, it is normally intended that the frequency as supplied by frequency source 7 be held nominally constant for a measurement cycle. For the first embodiment, it is desirable to derive the frequency of source 7 from an available oscillator such as the one which provides the microcontroller clock. In the second embodiment described below, the driving frequency is self generating and the circuit is configured to maintain the phase of the response of the resonant elements relative to the excitation at a nominally constant phase with the phase preferably chosen to maintain oscillation at or near the resonant condition of the circuit.

The microcontroller 1, through an iterative cycle, selects a DC bias current which causes the resonating circuit of the selected sensor to operate close to its reference phase state (i.e., in its target range) as indicated by its measured output phase angle. The bias current selection is normally established by issuing a sequence of one or more commands to a D to A converter of biasing circuit 6 and evaluating the resulting phase response. Since, during use, readings are typically taken at rates of one or more readings per second, the change in magnetic field between successive readings for a given sensing element is normally small. Thus, it is preferable to use the immediately preceding reading for the particular sensing element to calculate the bias setting to use for the next reading thereby eliminating the need for trials at multiple bias current settings as each reading is taken. The range in sensed magnetic field for which the response of the phase shift of the output is reasonably linear is typically less than, but still a significant fraction of, the range of variation in the component of the Earth's magnetic field to be measured. Thus, short term variations in the magnetic field to be measured may be included in the linear range of the phase detection portion of the circuit making use of the previous reading to establish the bias setting for the next reading a useful optional feature of the invention. The selected sensing element is driven to the bias selected by biasing circuit 6 and to the frequency and input driving phase established by the input frequency source 7. The driver circuit 9 drives the resonant magnetic field sensing element of the sensor 10 selected by sensing element selector circuit 8 at the frequency determined by frequency source 7 and at the bias current determined by biasing circuit 6. Phase detector 11 shapes the oscillator output in a way that preserves phase information to prepare it for the phase shift measurement of the response of the selected sensing element by phase comparator 12. Phase comparator 12 compares this phase information with the phase of the input frequency source 7 which drives the sensing element at a nominally constant frequency. Phase comparator 12 outputs an output signal 5 which is based on the comparison. The output signal, for example, may be a voltage, which represents the phase angle difference between the signal driving the sensing element and the signal indicative of the response of the sensing element. The phase may be measured by any one of a number of known methods which may or may not require the use of an A to D converter. The A to D converter, if required, is optionally included in the microcontroller 1.

As indicated above, for each individually selected sensing element, it is generally necessary to determine a bias current which brings the output phase acceptably close to its reference phase condition (i.e., target range) and it is preferable to make this determination based on previous measurements, particularly on the immediately preceding measurement taken with the currently selected sensing element. For example, as will be described in more detail below, conversion constants may be established by calibration routines to convert an increment of phase angle to an approximately equivalent increment of bias current and to convert bias current to an approximately equivalent magnetic field strength. It is also preferable to determine and record the resultant field (or equivalent bias current for zero external field) which brings the sensing element to its reference condition. Using these constants and recorded previous reading values, the required bias current may be approximately determined by algebraically summing the bias current which is nominally equivalent to the negative of the field strength measured in the previous reading for the selected sensing element with the bias current required to produce the targeted resultant field to bring the coil to its reference phase condition. Stated in another way, the bias current is preferably set close to the bias current calculated to bring the sensing element to its targeted reference phase condition for the field strength read in the previous measurement made with the selected sensing element.

As indicated above, there are normally two rather widely separated values of bias current which meet the condition of bringing the phase response of the resonating circuit close to its targeted reference condition. To make a complete measurement for a given coil, it is preferable to determine the bias current required to bring the sensing element close to its targeted reference condition (i.e., to its output target range) at each of the two separated bias currents for which the targeted reference phase condition may be attained and to take two individual readings one at each of these bias settings for the sensing element. For each of the two individual readings, the bias current is set and after an appropriate settling time, one or more measurements of the phase are taken and preferably evaluated and possibly averaged to determine a resulting phase. The evaluation preferably includes a check for scatter of the values read when multiple readings of phase are taken. It is preferable to space at least two of the readings to approximately the interval of a half cycle of the AC power line frequency and to compare these two readings to detect unacceptably high disturbances from magnetic fields created by AC power line components. It is also preferable, for example, to average these two readings to determine a result which has partial rejection for the AC power line frequency or to use any of a number of other digital or analog filtering techniques to provide a degree of rejection of cyclic variations in the magnetic field from sources such as an AC power line that may be present in the readings. This resulting phase measurement is then preferably converted to an equivalent increment in bias current which is algebraically summed with the bias setting used for the measurement to determine an equivalent bias current which should nominally bring the given coil to its targeted reference phase condition. Typical A to D converters when used in the phase measurement process make it possible to take readings in rapid sequence with little programming overhead. It is a desirable option of this invention to incorporate sequences of multiple readings of phase for a particular bias current settings and to apply a digital filtering sequence and screening criteria to the sequences of readings taken to improve the resulting accuracy and selection of the data taken. Later in the sequence, the same type of measurement is made with the given sensing element at the other bias point which brings the sensing element to substantially the same reference phase condition with the direction of the resultant field in the sensing element of nearly the same magnitude but reversed in direction. An equivalent bias current is calculated for this measurement. As will be illustrated in more detail with reference to FIG. 5, the negative of the average of the two equivalent bias levels obtained for the given sensing element yields the preferred reading which when converted to equivalent field strength is the preferred value to use for the component of field strength measured by the sensing element. Measurements made in this way tend to partially cancel effects of ambient temperature and certain other unwanted distortions.

Two or three sensing elements are typically used to measure two or three orthogonal components of a magnetic field vector and it is normally beneficial to minimize the skew between the time that successive readings are taken so that the measured components of the vector all more nearly represent a value realized at a single instant of time. It is preferred to minimize the skew in the readings by ordering the successive readings so that the first of the two readings for each of the sensing elements used for a prescribed composite measurement is taken in an ordered sequence and then the measurement at the alternate bias level for each sensing element is taken in the reverse order. For the purpose above, it is not necessary to restrict which bias direction is read first for a particular sensing element included in the nested sequence. Corresponding readings for each sensing element are averaged to obtain the resultant values. This is beneficial because when the level of the field to be measured is changing as it is when a vehicle is turning, the averaged value will tend to be the value of the field at the time half-way between the times at which each of the two measurements is taken. For convenience, this is referred to as the midpoint time for the measurement. With proper timing such as equal spacing of successive measurements and use of the measurement order just prescribed, the midpoint time for each complete measurement may be substantially the same for all of the readings taken in the nested sequence thereby minimizing the skew in the final averaged readings.

The timing of one of the two readings in the averaged pair relative to the other may be used for additional purposes including inclusion in the filtering algorithms. For example, if the readings are separated in time by an odd number of half cycles of the AC power line frequency, their averaging effect will also have rejection of magnetic fields generated by AC power line sources. Methods to select or optionally to determine which of the two bias points is being approached will be given elsewhere in this document. The AC power line frequency is likely to be either 50 Hz or 60 Hz. There are a number of options for dealing with this variation which include, but are not limited to, the following. First, a filter is an option and, if used, may not need to be especially sharp, in which case a compromise filter tuned to reject 55 Hz, for example, may be chosen or a filter to reject both frequencies may be used. A frequency content analysis which may use, for example, a Fourier transform or Fourier series analysis, may be applied to readings to determine the required filter rejection frequencies. The frequency may be selected directly or inferred from a user input for calibration and may be logically combined with a user initiated calibration sequence to determine the correction for true north versus magnetic north. The frequency may also be inferred from GPS input data since AC power line frequency tends to be standardized over relatively large geographic areas.

In some embodiments, it may be possible to confuse which bias point is being approached and, therefore, necessary to verify the selection and to take appropriate action based on the results of the verification. Such difficulties might occur, for example, with large, unexpected changes in the field to be measured or in initial startup of the device. Since the increment in bias to go from the targeted reference condition with the resultant field in the sensing element in one direction to the targeted reference condition with resultant field in the sensing element in the other direction is in most designs nearly constant for a given sensing element, it is preferable to measure this incremental value in bias current and to use it in determining the bias setting for the alternate point for which the phase output is close to the targeted reference condition. Since the relationship between phase shift and bias current is usually temperature sensitive, it is preferable to use a calibration routine to periodically measure and recalculate the relation between an increment of phase shift and an equivalent increment of bias current and to also recalculate the difference in bias between the two targeted reference conditions. Using this relationship, the deviation in the measured phase from the targeted reference phase may be converted to a near equivalent deviation between the bias current supplied and the bias current that would bring the selected resonating circuit to its targeted reference phase condition. The bias to bring the circuit response close to its targeted reference phase will be referred to as the "reference bias." The reading may then optionally be expressed in terms of this reference bias current and in most embodiments, further use of the phase angle measurement which has served its main purpose may be dropped. The relation between an increment of phase shift and a nearly equivalent increment in the bias current may be expressed as a conversion factor from phase shift to bias current. The level of the reference bias is normally related to the strength of the axially aligned component of the field in which the coil of the sensing element is placed by a constant. This constant is the multiplier used to convert bias current to equivalent field strength and the value is determined by the configuration of the sensing element and the resulting equivalent field strength created by an increment of bias current in the winding. The general relationships just noted may be used to an advantage to convert between near equivalents in increments of phase shift, increments of bias current, and increments of measured magnetic field strength. In practicing the invention, there is considerable latitude in the choice of phase, bias current, or actual field strength used to represent the measured value as well as in the particular near equivalent relationships which are utilized as well as in the order in which such relations are applied since commutative and/or associative laws of mathematics may be applied to rearrange the order of many of the calculations.

Figure 4:
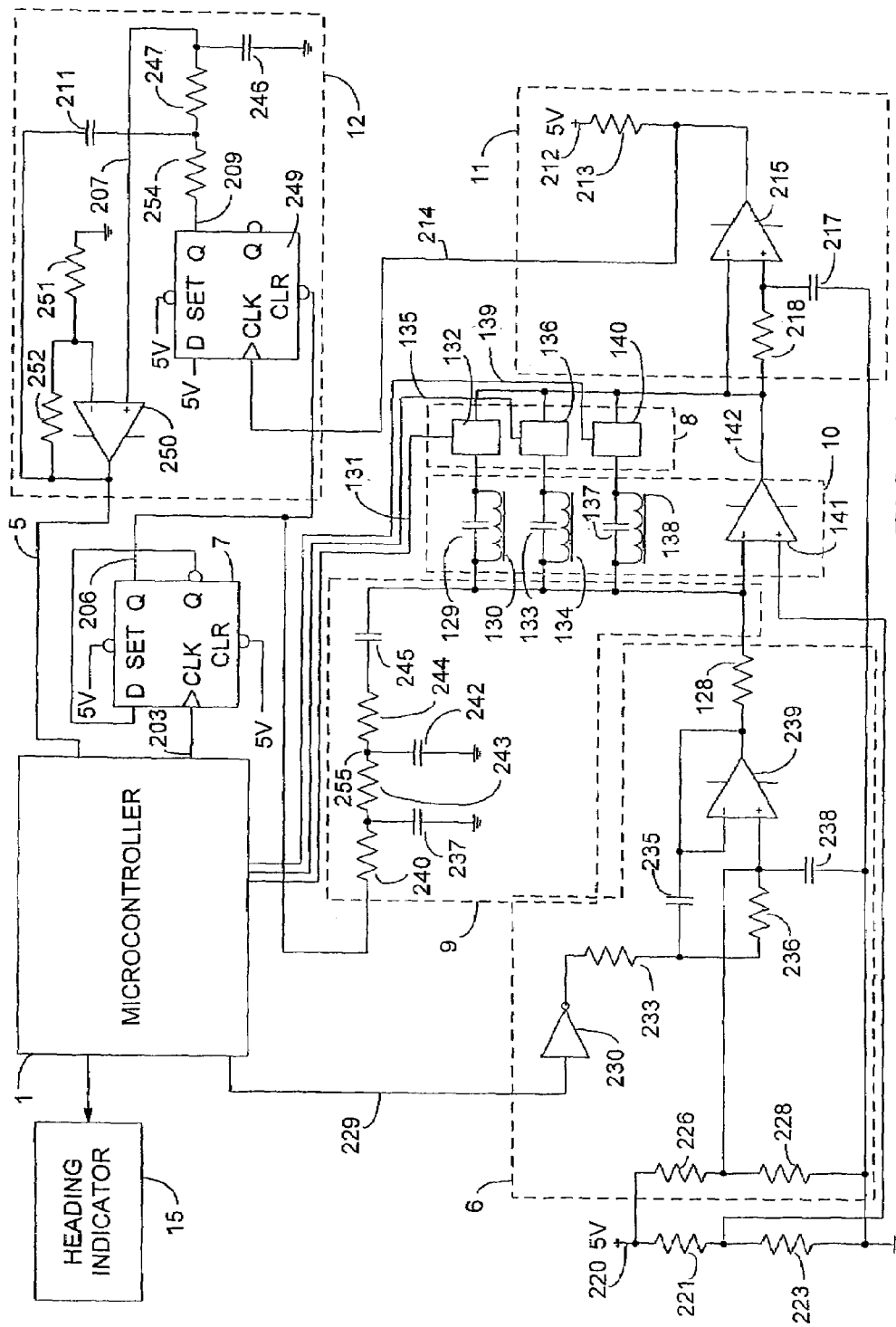
FIG. 4 is an electrical circuit diagram in block and schematic form illustrating one implementation of the magnetometer of the first embodiment.

FIG. 4 shows an exemplary implementation of the phase response based magnetometer of the first embodiment. Specific resistances, capacitances, and part numbers are provided in the description below that are merely exemplary of one of many possible implementations of the first embodiment. The present invention is therefore not limited to the specific parts described below.

Microcontroller 1 outputs a high signal on one of the three lines 131, 135, or 139 to close the respective analog switch 132, 136, or 140 (e.g., part No. 74HC4066) of sensing element selector 8, thereby connecting sensing inductor 130, 134, or 138 and its associated resonating capacitor 129, 133, or 139 (e.g., 0.001 µf) of sensor(s) 10 to an output 142 of an operational amplifier 141 (e.g., part No. TLC084). The output 142 of operational amplifier 141 is filtered by the combination of a resistor 218 (e.g., 100 kΩ, 1%) and a capacitor 217 (e.g., 0.033 µf) so that the average value of output 142 is input to the positive input of a comparator 215 (e.g., part No. LM311) while the output 142 of amplifier 141 is fed directly to the inverting input of comparator 215. The open collector output of comparator 215 is pulled high by a resistor 213 (e.g., 1 kΩ), which is connected to the positive supply at 212. The digital signal 214 output from comparator 215 is inverted and 180 degrees out of phase with the output 142 of the selected sensing element LC circuit. The amplifier 141 also inverts the output 142 relative to the signals input at summing resistors 128 and 244 (e.g., 499 Ω, 1%, and 2.92 kΩ, respectively) so the two phase reversals offset each other.

Figure 7:
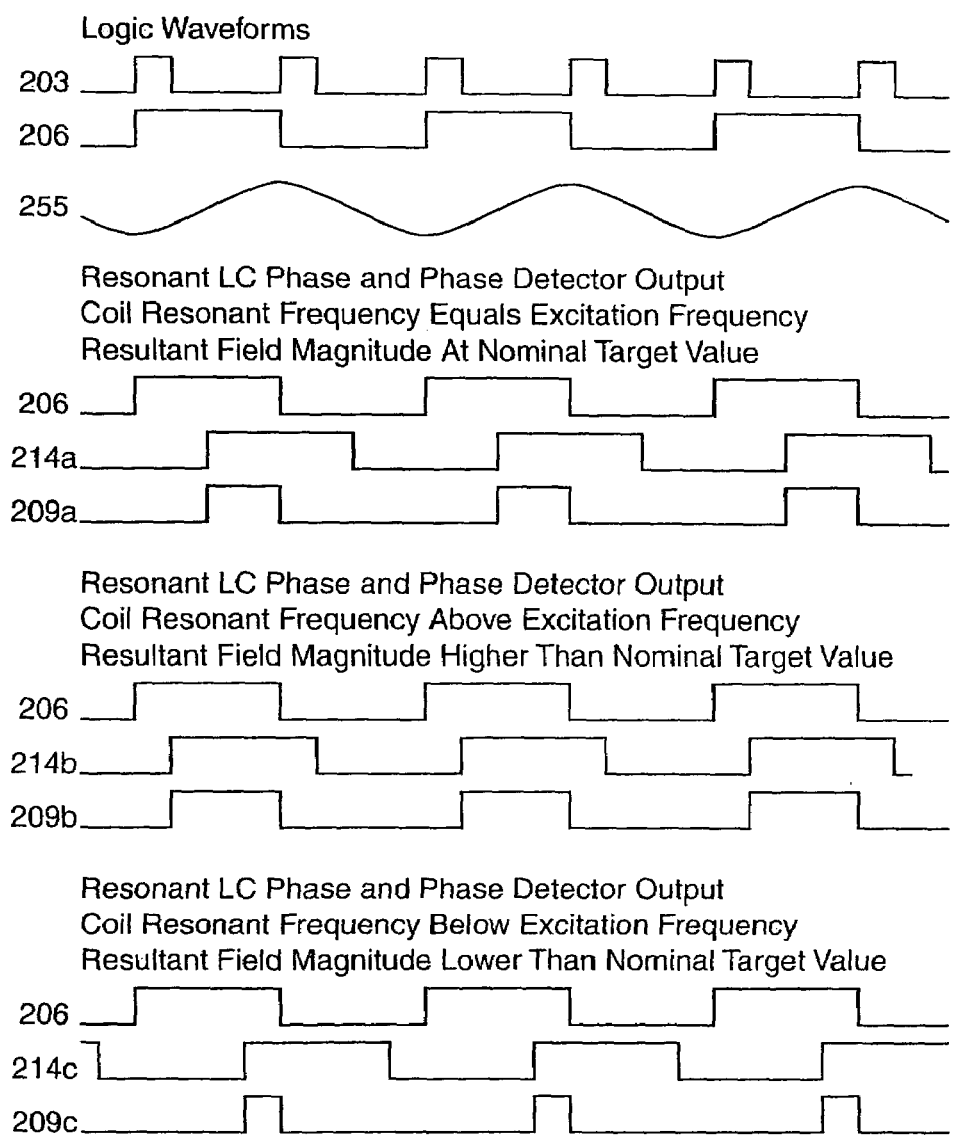
FIG. 7 shows various waveforms that may be generated by various portions of the circuit shown in FIG. 4.

For the following discussion, FIG. 7 depicts example waveforms which are shown along side of the reference number from FIG. 4 for the point to which they are related. Microcontroller 1 outputs a frequency which is normally held constant at two times the frequency chosen to drive the selected sensing element LC circuit. A D-type flip-flop (e.g., part no. 74HC74) serving as frequency source 7 divides the frequency of the clock signal on line 203 by two and thereby outputs a signal 206 having a duty cycle very close, but not necessarily equal, to 50 percent. If the microcontroller can supply a stable output duty cycle, which is preferably close to 50 percent, the flop-flop 7 may be eliminated and signal 206 may be supplied directly from the microcontroller.

Resistors 240, 243, and 244 (e.g., 9.09 kΩ, 28.0 kΩ, and 2.92 kΩ, respectively) and capacitors 237 and 242 (e.g., 470 pf, 5%; and 1000 pf, 5%, respectively) form a two-pole RC filter which is designed to phase shift the signal 206 approximately 90 degrees and to substantially attenuate higher frequency components in the square wave signal 206. The nominal 90 degree phase shift approximately centers overall operation of the phase detector 11 so that its output 214 is approximately 50 percent of its full scale output when the circuit is at resonance and provides phase detection of approximately plus and minus 90 degrees of phase shift from this nominal center. It is preferable that the two poles of the filter have time constants which are approximately equal, but this is balanced against a preference to keep cost and complexity to a minimum so an operational amplifier is not used and the poles of the filter have time constants which are not equal. Without buffering, the second cascaded RC circuit loads and reflects portions of its signal back to the first, both effects tending to separate the filtering time constants. Two general guidelines which help in the design to reduce spacing between the time constants are to choose a design where within other constraints of the design, the resistance of resistor 243 is high tending to decouple the RC circuits and where the output voltage on capacitor 242 is loaded by the output and tends to reduce the signal which may be reflected back. It is prudent to write the full equations for the response of the RC filters in the circuit and use their evaluation to critique design choices. The filtering time constants should be chosen to achieve the desired phase shift at the chosen excitation frequency. An AC coupling capacitor 245 (e.g., 0.05 µf) blocks DC current so that the excitation is separated from the source of DC bias at this point in the circuit. The filter which was just described is included to attenuate higher frequency components in the excitation and thereby minimize nonlinearities in the phase response due to higher frequency components in the AC excitation signal and also to provide the phase shift to establish the desired centering of the operating range for the phase comparator 12. By attenuating higher frequency components, the filter serves to bring the AC excitation closer to a sinusoidal signal.

Signal 229 is a pulse-width modulated signal generated by microcontroller 1 that is used as the input to biasing circuit 6 to set the DC bias current level for the field sensing inductor (130, 134, 138) in the selected sensing element LC circuit. A well regulated supply voltage, or optionally, a separate stable reference voltage which may approximately equal the supply voltage supplies nodes 212 and 220 and the logic elements 1, 7, 230, and 249 of the circuit. In this circuit, a supply and reference voltage of 5 volts is assumed. A buffer element 230, which may be either inverting or non-inverting, is preferably of low impedance output and preferably has low and stable voltage drop to the negative supply when switched low and to the positive supply when switched high. The gate should be supplied by the stable reference voltage so that the output will be switched very close to the reference voltage in the high state. Thus, the input to a resistor 233 (e.g., 49.9 kΩ, 1%), which is coupled to the output of buffer element 230, is duty cycled between 5 volts and ground at substantially the duty cycle supplied by PWM output 229. Resistors 226 and 228 (e.g., 600 kΩ, 1%; and 200 kΩ, 1%) form a divider and a load to center and limit the output range of the PWM circuit to approximately 0.5 to 3.5 volts. A buffer amplifier 239 (e.g., part No. TLC084) serves as the active element in a two-pole filter of the PWM output and buffers the filtered PWM output and supplies the bias to the summing input of amplifier 141 through summing resistor 128. The inverting input of buffer amplifier 239 is fed back to the output of buffer amplifier 239 and is also coupled to the opposite side of resistor 233 from buffer 230 via a capacitor 235 (e.g., 0.033 μf). The non-inverting input of buffer amplifier 239 is also coupled to the same end of resistor 233 via a resistor 236 (e.g., 49.9 kΩ, 1%). The non-inverting input of buffer amplifier 239 is also coupled to a terminal between voltage dividing resistors 226 and 228 and is also coupled to ground via a capacitor 238 (e.g., 0.033 μf).

Another divider formed by resistors 221 and 223 (e.g., 1.5 kΩ, 1%; and 1.0 kΩ, 1%, respectively) provides a 2-volt operating reference for amplifier 141. This approximately centers operation of the amplifier with its general ability to sink appreciable current at 0.5 volt and to source appreciable current at 3.5 volts providing a general range of operation of plus or minus 1.5 volts for the drive signal for the circuit. The voltage drops across the analog switches and the AC voltage at resonance must be controlled carefully by design selection to keep the required drive voltage range within the drive capability of the operational amplifiers so that saturation does not degrade readout accuracy.

Phase comparator 12 includes a flip-flop 249 (e.g., part No. 74HC74) having signal 214 applied to its clock terminal and its reset terminal coupled to the output of frequency source flip-flop 7. When the phase shift is within an expected measurable range, the rising edge of signal 214 from phase detector 11 occurs while the output 206 from frequency source flip-flop 7 is high so flip-flop 249 is not reset and a one is clocked to an output 209 of phase comparator circuit flip-flop 249 by the rising edge of signal 214. This output remains high until the signal 206 from the frequency source 7 goes low resetting flip-flop 249 and causing its output to go low. Thus, the duration of the high signal from phase comparator flip-flop 249 is controlled by the phase difference between the phase of the driving signal 206 and the phase of the measured response 214 as required. Resistors 247, 254, 251, and 252 and capacitors 211 and 246 with an operational amplifier 250 (e.g., TLC084) form a two-pole filter to average the duty cycled phase detector output. Resistor 254 (e.g., 11.5 kΩ, 1%) is coupled to the output of flip-flop 249 so as to receive signal 209. The other end of resistor 254 is coupled to both a resistor 247 (e.g., 11.5 kΩ, 1%) and the output of amplifier 250 via capacitor 211 (e.g., 0.01 μf). The opposite end of resistor 247 from resistor 254 is coupled to ground via capacitor 246 (e.g., 0.01 μf) and is also coupled to the non-inverting input of amplifier 250. A filtered signal 207 is thus provided to the non-inverting input of amplifier 250.

The non-inverting operational amplifier circuit, with amplifier 250 and input and feedback resistors 251 and 252 (e.g., 48.7 kΩ, 1%; and 44.2 kΩ, 1%, respectively), buffers the input signal 207 and provides gain to output a filtered and amplified phase measurement signal 5 which is input to an analog to digital converter provided in microcontroller 1. Any of a number of phase discriminators may be used. For example, the circuit may be configured to utilize a gate or a set-reset flip-flop instead of the D-type flip-flop 249.

Figure 11:
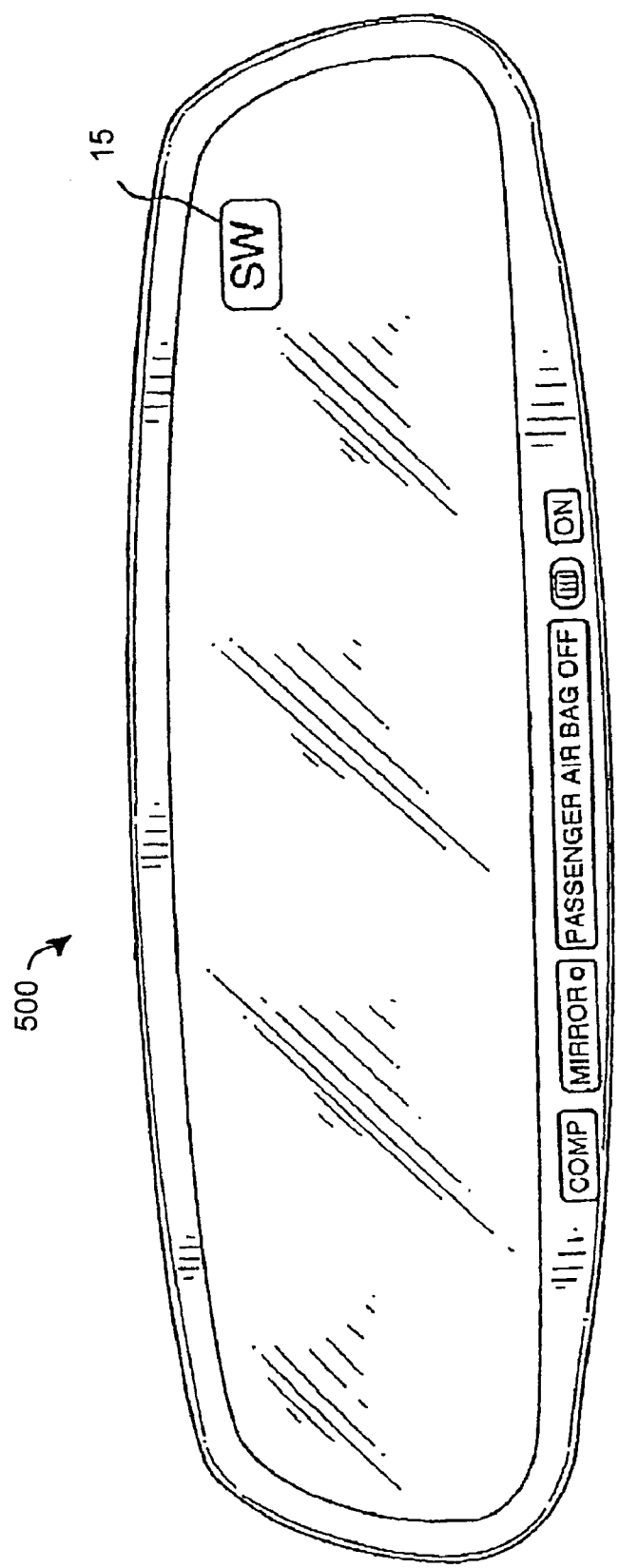
FIG. 11 is a perspective view of a vehicle rearview mirror assembly incorporating the electronic compass of the present invention.

Heading indicator 15 may be configured as a display for visibly displaying the vehicle heading. Such a display may be configured as an alpha-numeric display of the type disclosed in commonly assigned U.S. patent application Ser. No. 09/359,616, entitled "LOW EMI MULTIPLEXED DUAL DISPLAY," filed on Jul. 22, 1999, by Robert R. Turnbull, now U.S. Pat. No. 6,346,698. Alternatively, a graphical compass display may be utilized such as that disclosed in commonly assigned U.S. patent application Ser. No. 09/311,955, entitled "ELECTROCHROMIC REARVIEW MIRROR INCORPORATING A THIRD SURFACE METAL REFLECTOR AND A DISPLAY/SIGNAL LIGHT," filed on May 14, 1999, by William L. Tonar et al., now U.S. Pat. No. 6,356,376. The disclosures of both these references are incorporated herein by reference. The heading indicator 15 is preferably incorporated in a rearview mirror assembly 500 (FIG. 11) in a manner similar to that disclosed in the above-referenced U.S. Pat. No. 6,356,376. Alternatively, the heading indicator may be incorporated into an overhead console mounted to either the vehicle headliner or the vehicle windshield proximate the rearview mirror assembly or it may be incorporated into the vehicle instrument panel or in any other vehicle accessory or location within the vehicle. The heading indicator may be a functional component of a vehicle navigation system display as well.

It is also possible that heading indicator 15 may provide an audible indication of the vehicle heading as an alternate or additional mechanism for providing the vehicle heading information to the vehicle operator. Such an audible indicator may include a voice synthesizer and a speaker for generating audible messages as to the heading of the vehicle. In this regard, it may be advantageous to also incorporate a microphone and voice recognition circuit such that the microcontroller may respond to an audible spoken prompt from the vehicle operator to generate an audible vehicle heading indication. An example of a rearview mirror assembly incorporating a microphone, voice recognition system, voice synthesizer, and optional speaker is disclosed in U.S. Patent Publication No. 2002/0032510, entitled "VEHICLE REARVIEW MIRROR ASSEMBLY INCORPORATING COMMUNICATION SYSTEM," filed on Apr. 5, 2001, by Robert R. Turnbull et al., the entire disclosure of which is incorporated herein by reference. As noted in the above-referenced published patent application, the speaker may be a speaker of the vehicle's existing audio system rather than a dedicated speaker provided in the rearview mirror assembly or in some other vehicle component.

FIG. 7 depicts waveforms of the reference frequency 203 from the microcontroller, the 50 percent duty cycle excitation frequency 206, and the filtered and phase shifted excitation signal 255. Curves 214a, 214b, and 214c are representative waveforms of the output 214 of phase detector 11; and curves 209a, 209b, and 209c are representative waveforms of the output 209 of phase comparator 12. The "a" waveforms are for a bias condition shown at 457 or 458 in FIG. 5. The "b" waveforms are for a bias condition shown for a point on curve portion 452 above point 457 or on curve portion 454 above point 458 in FIG. 5. The "c" waveform is for a bias condition shown for a point on curve portion 452 below point 457 or on curve portion 454 below point 458 in FIG. 5. An exclusive OR gate or other form of phase comparator may readily be used. The one chosen was used because of the available flip-flop and because the output stays at 0 for the 180 degrees of the 360 degree range that is not used.

In modern vehicles, information from GPS units, gyroscopes, and certain devices, which indicate inclination of the sensor from the horizontal and/or from a reference orientation within the vehicle as well as inputs from a user initiated calibration sequence, may be available and useful in determination of the heading of the vehicle. Inputs in the user initiated calibration sequence typically include an indication of the deviation of true north from magnetic north in the locality where the compass is to be used. When GPS heading information is available, this information may be used to introduce a calibration offset to compensate for the difference between magnetic and true north as well as for other systematic errors in heading indication. Also, the compass heading information, which is more immediately responsive to changes in direction than heading information derived from GPS readings and which may still be available when GPS signals are lost, may be used to augment the GPS or gyroscope readings for purposes of navigational control or tracking instead of or in addition to its use for simple display of vehicle directional heading. An example of a compass system that utilizes GPS information and which incorporates a GPS antenna and receiver circuit within a rearview mirror assembly is disclosed in U.S. patent application Ser. No. 09/605,230 entitled "REARVIEW MIRROR WITH INTEGRATED MICROWAVE RECEIVER," filed on Jun. 28, 2000, by Robert R. Turnbull et al., now U.S. Pat. No. 6,407,712, the entire disclosure of which is incorporated herein by reference. If the magnetometer sensors are contained within the housing of the rearview mirror assembly that also houses the mirror itself, it is preferable to implement a tilt sensor of the types disclosed in commonly assigned U.S. Pat. Nos. 6,023,229 and 6,140,933, the entire disclosures of which are incorporated herein by reference.

There are many hard and soft magnetic effects in a vehicle which must be compensated for. In addition to the contribution from iron in the engine and vehicle structure, powerful magnets in DC motors often make strong contributions, and it is frequently desirable to provide the capability to compensate for disturbing fields contributed by the vehicle which are more than an order of magnitude greater than the typical horizontal components of the Earth's magnetic field. The sources which contribute the strongest disturbing fields normally persisted over extended time periods even over the life of the vehicle, but generally weaker fields, which are still strong enough to add complication to automatic calibration algorithms, are created by transient operation of many accessories such as clutch solenoids in air conditioners, window defoggers, windshield wipers, and blower motors. The horizontal components of the Earth's magnetic field are typically in the range of plus or minus 0.2 gauss in the continental United States excluding Alaska and roughly half of that in Alaska. Further, the resultant field required to bias the inductor so that its phase response is close to the reference condition may require bias levels whose magnetic field equivalents are, for example, plus or minus 4 gauss. For proper operation, these bias levels must be algebraically added to the automobile's component and the component of the Earth's magnetic field bringing the required range for operation of the bias circuit to more than 30 times the range required to balance the typical horizontal component of the Earth's magnetic field alone. This results in the full scale of the measurement of the Earth's magnetic field being, for example, 3.3 percent or less of the range in the equivalent field strength of the bias current which must be supplied by the circuit. Additionally, even higher fields requiring even greater bias current may be desirable to make it possible to systematically cycle the magnetic core through a schedule of alternating magnetic direction beginning with field levels which cause relatively hard saturation in each of the alternating directions and continuing through cycles of successively lower magnetic drive to provide a degaussing or at least a preconditioning sequence to precondition the sensor core to a state for repeatable and reliable operation. Optionally, a separate switchable and reversible source may, if required, be used for degaussing purposes. The magnetic material in the core on which the above is based is not known but is thought to be a variant of Metglas7 2605 or 2705 materials available from Honeywell Corporation. Use of variable bias current to counterbalance the ambient magnetic field and to bias the metal in the core of the field sensing inductor to a relatively narrow portion of its variable flux range as practiced in this invention reduces if not eliminates the need for linear response over extended ranges of the variable inductance of the core due to changing field levels within the core. Alternative materials may be used, such as annealed versions (particularly those annealed in an axial or perhaps a transverse field) of Metglas8 2714A for which a trace 601 of resonant frequency versus axially aligned field strength is shown in FIG. 6. For comparison, FIG. 6 also depicts the curve 602 which is the corresponding curve for a similar coil and circuit but with a core of the material used in the plot in FIG. 5. The lower bias current of approximately 1.3 milliamps to reach a good operating bias level for the material of curve 601 as compared with approximately 2.3 milliamps required to reach a comparable operating point for the material of curve 602 makes the material of curve 601 a better choice, at least to meet a criteria for reduced bias current.

In current art for relatively inexpensive magnetometers, operating frequencies are typically used to indicate field strength and cycle period is typically based on the response of a resistance times inductance time constant with the cycle duration determined by threshold detection and not on an LC resonance. In a typical cycle, the core is typically driven through an extended part of its range of magnetic operation, typically into fairly strong saturation in one direction. For example, the RL inductance circuits that are in most common automotive use today use per cycle flux excursions that are equivalent to roughly 9 gauss for measuring over a nominal range of ±2.5 gauss (5 gauss minus to plus range). The preferred circuits of the present invention use per cycle flux excursions of nominally less than one-fifth of that of the conventional circuits. That is, they are typically less than 2 gauss peak to peak, which is much less than the 6 gauss (±3 gauss) measuring range. In general, prior art circuits that attempt to measure the full input range with one or two bias settings must use per cycle excursions for which the sum of the driving flux with the flux to be measured traverses the effective range of the response of the core material. This generally requires a per cycle peak to peak flux excursion which at least equals the total minus to plus flux range to be measured. A fixed bias is typically applied to bias operation toward one side or the other of the two-sided operating curve. The biasing effect is often reversible through some form of switching so that opposite sides of the saturation curve may be selected, but for units utilizing the change in inductance due to the variable permeability of the core, the magnitude of the bias is normally fixed in each direction and in particular is not variable in more than two steps over a large, calibrated, bi-directional range as is the case with the preferred embodiments of this invention.

It is generally desirable but not required to have resolution of roughly one degree in the ability to determine the direction of the heading. Accuracy does not normally need to be nearly this high because an eight point compass display having 45 degrees per step is normally used, however, calculations to isolate the effects of vehicle fields from the Earth's magnetic field make added accuracy in the measurements generally beneficial. In the example above, with the required bias of plus or minus 4 gauss at the selected operating points of the coil and an additional disturbing field of approximately plus or minus 2 gauss, repeatability of about one part in 3400 in setting the bias current through its total plus or minus range is required to generally support the resolution of one degree of resolution in readings of direction. This can be reduced by almost three to about one part in about 1200, if a core with a much lower bias requirement at its preferred operating bias is used. The 2714A material would reduce the required bias so that a repeatability to about one part in 2400 would be required if the circuit was optimized for its use as a core material in the example above. Another option is to provide a separate two state bias circuit which is switched to provide the large and stable plus or minus step in bias required to center operation for a positive or for a negative resultant biasing field in the core. The multi-step or continuously variable bias source is then used to adjust bias levels at the selected operating point. The large plus or minus 4 gauss steps to select the operating bias in the example above requires a stability and repeatability of better than one part in 2200 to support a one degree resolution. The D to A converter to adjust the bias current in each of the two ranges should have a setting stability and repeatability of about 1 part in 1200 to attain a resolution of 1 degree. Note that here and likely also with most other current art implementations, the relative stability and repeatability of the plus or minus bias current levels will tend to affect overall accuracy in proportion to the size of the total shift which they create in the biasing magnetic field as compared with the smallest increment of magnetic field which can be measured. Thus, a magnetic core material, which requires a lower bias for proper operation and a circuit which will tolerate side effects such as reduced linear operating range which may come with using the material, results in a generally more robust, more accurate, and less tolerant sensitive circuit. When the range of the magnetic field to be measured is greater than the spread between the opposed operating bias levels, the device must also determine which one of the two points is the current operating point. Embodiments of this invention meet the requirements to operate with the reduced linear range and with the capability to properly handle proper distinction between the two possible circuit inputs which yield the same phase response. To determine which bias point is being approached, an incremental change of bias may be applied in a given direction, and phase will always increase for a first specific operating point for which the resultant field is in one direction and will always decrease for the other operating point for which the resultant field is in the opposite direction. A check based on this fact provides a simple way to determine which of the two bias points is being approached.

To achieve a resolution of approximately 1 degree in directional measurement while using variation and balance in bias current alone to determine readings requires an incremental resolution on the order of 11 to 12 bits for the D to A conversion used to set the bias current level. This incremental precision is well above the 8-bit incremental precision of D to A converters that are readily available with many 8-bit microcontrollers which are otherwise suitable for the application. Eight-bit pulse-width modulated D to A converters are available in many low cost microcontrollers and may be readily implemented in application-specific integrated circuits. In these D to A converters, the duty cycle of the pulse-width modulated output depends mainly on the short term stability of the microcontroller clock which is usually very high so that with high analog quality of the duty cycled switching of the output, the accuracy of each of the averaged output levels may be much higher than the 256 step incremental resolution of the converter. The phase measurement is used first to indicate that the bias current has been adjusted so that the output phase response of the LC circuit is acceptably close to its targeted reference level (i.e., in the target output range). In some applications of the invention which have a bias current generator of adequate resolution, this may be all that is required of the phase detector. However, as indicated in examples, this normally requires a higher resolution D to A converter which is not normally available on a low cost microcontroller and also may require an unduly cumbersome and perhaps unacceptably slow iterative sequence to reach the setting precision which is required. This is particularly apparent when one considers that rather high levels of oscillation may be present in the magnetic field at AC power line frequencies. Furthermore, adequate filtering of the pulse-width modulated output of the low cost D to A converter may present a serious problem if coupled with a requirement for fast settling time to allow a successive approximation approach to be used. The procedure detailed above to measure the deviation of the output phase from its targeted reference value and to compute and apply an appropriate correction to the bias current actually supplied for the measurement to compute the bias current, which would bring the coil to its reference condition, greatly reduces the number of steps of resolution required for the D to A converter and may greatly speed the iteration process in achieving a bias current setting which is adequately close to the target value while additionally providing added sampling and digital filtering capabilities. As illustrated above, a desirable type of phase measuring circuit is one which makes a comparison of the phase of the output response of the LC with a reference phase which has an appropriately selected and preferably fixed phase angle relative to the phase of the driving signal. The output voltage of a digital phase comparison circuit whose output switches from rail to rail may simply be averaged by an RC circuit to produce a voltage which is indicative of the phase relationship between the driving reference and the response of the LC circuit. The slope of the phase of the output response as a function of the deviation of the resonant frequency from the driving frequency is approximately proportional to the Q of the LC circuit. The Q is in turn partially dependent on the resistance of temperature sensitive wire in the inductor windings. A good solution to the problem both of establishing the required conversion relationship between an increment in the measured output of the phase indicating circuit and the equivalent increment in bias current is as follows. During a period when the measured field is relatively steady, the bias current is first adjusted so that the phase of the LC circuit is acceptably close to its reference value but preferably to one side of the reference value. A careful, preferably averaged reading of the phase response is then taken. Next, the bias current is adjusted by a known number of steps so that the phase is still acceptably close to, but preferably on the other side of, the reference value. A second measurement of the phase angle is then taken. The conversion factor is then computed from phase shift to bias current to convert from phase increment to equivalent bias current increment by taking the ratio of the difference of the bias current applied for the successive readings to the corresponding difference of the phase angle measurements for the two successive readings. This process may be repeated frequently enough to acceptably track changes in phase response caused by changes in coil temperature. An optional method to practice the invention is to take two measurements of phase verses bias current preferably with each measurement close to but on opposite sides of the reference phase value and to use conventional interpolation to compute the bias at the reference phase output value. To minimize introduction of erroneous or noisy readings, values which are not in an expected range may preferably be rejected.

The phase jitter caused by ripple in the output of the pulse-width modulated bias generator circuit may be reduced by the second stage of filtering of the phase detection circuit outlined above. For the high precision required for the bias current, settling times of, for example, 10 divided by the roll off frequency of the filter in radians per second may be appropriate when large incremental changes are made to the pulse-width duty cycle of the circuit. Since the phase response is highly dependent on the bias setting, the bias current must be reasonably well settled out before settling really begins for the phase circuit. For example, for the pulse-width modulated bias current generator setting, a filtering roll off frequency, which is just low enough to provide adequate attenuation of ripple of the pulse-width modulator output, is desirable and for the phase detector output, a roll off to filter the ripple in the phase detector output and to perhaps also filter ripple due to a modest amount of residual ripple in the bias current is desirable. For a repetition rate of about 7 kHz for the pulse-width modulated output, a two pole low pass filter, preferably with imaginary poles but with high damping as, for example, with a Bessel filter design and a roll off corner of about 160 Hz, may function well. Such a filter requires roughly 10 milliseconds to settle to the necessary high precision following a large change in setting. The exact damping factor is not critical but, for example, with a Butterworth design which has lower damping than a Bessel design, ringing increases the settling time requirement by roughly 25 percent. Damping is preferably in the range which is greater than that exhibited by a Butterworth filter. The filter for the phase discriminator is also preferably of a similar type and damping factor but with a phase discriminator having a pulsed output in the 60 kHz range, for example, a roll off frequency in the range of 1.5 kHz and requiring several milliseconds of additional settling time beyond that required for the bias current circuit to settle is appropriate. The filters may be more complex than those just outlined in the example and similar arguments extended to settling times for more complex filters are considered to be part of this invention. With a known filter response, and a known increment in the D to A setting, it is possible and desirable to calculate and apply an over driving signal of an amplitude and duration which will bring the output approximately to its desired value. If the calculation is correct, the PWM output value should be very close to the desired value at the end of the calculated period for which the overdriven setting is applied. At this point, the PWM setting should be changed to the desired setting and since the value is already close to the one desired, settling to the desired accuracy should be much faster. This technique may be used to substantially reduce the settling time of the D to A converter.

Eight-bit A to D converters are commonly available as a standard feature or at modest cost on low cost microcontrollers. Such A to D converters should be adequate for the phase measuring process. Many such A to D converters have relatively high acquisition and conversion rates so that multiple samples of the phase readings may be taken, screened to reject readings with unacceptable noise levels and averaged to reduce overall noise in the readings. The capability to evaluate scatter and various other properties of a set of readings in addition to the use of averaging techniques is a valuable, optional part of the invention. The reason is that for a compass application, it is often better to hold the current reading or even to blank the reading than to present noisy and likely erroneous results. It is also beneficial not to alter stored calibration data or to make decisions which affect the calibration process on the basis of noisy data which would otherwise be assumed to be valid. The ability to sample the filtered phase detector output at practically any rate which is in the capability of the A to D converter, and to also sample it for any duration which fits the overall structure of the control process, opens the possibility which is considered part of this invention to average an integral number of samples taken over, for example, one full cycle of the power line frequency to provide effective integration of the signal over one power line cycle and thereby provide very high rejection of the ripple in the measured magnetic field caused by currents and magnetic components in an AC power system.

Calibration is the process of determining where the optimal bias points are. The target for the bias points is to center the resonant operating point of the LC tank circuit in the center of the linear range of the phase versus magnetic field curve. These points can be found using a variety of methods; one, for example, involves sweeping the bias from one extreme to the other and recording the resulting phase shift for each bias increment. The average of the highest and lowest A/D values in this set of measurements can be computed and the corresponding PWM bias values used as the initial calibrated bias values. A plot of an example bias curve is shown in FIG. 10.

Figure 10:
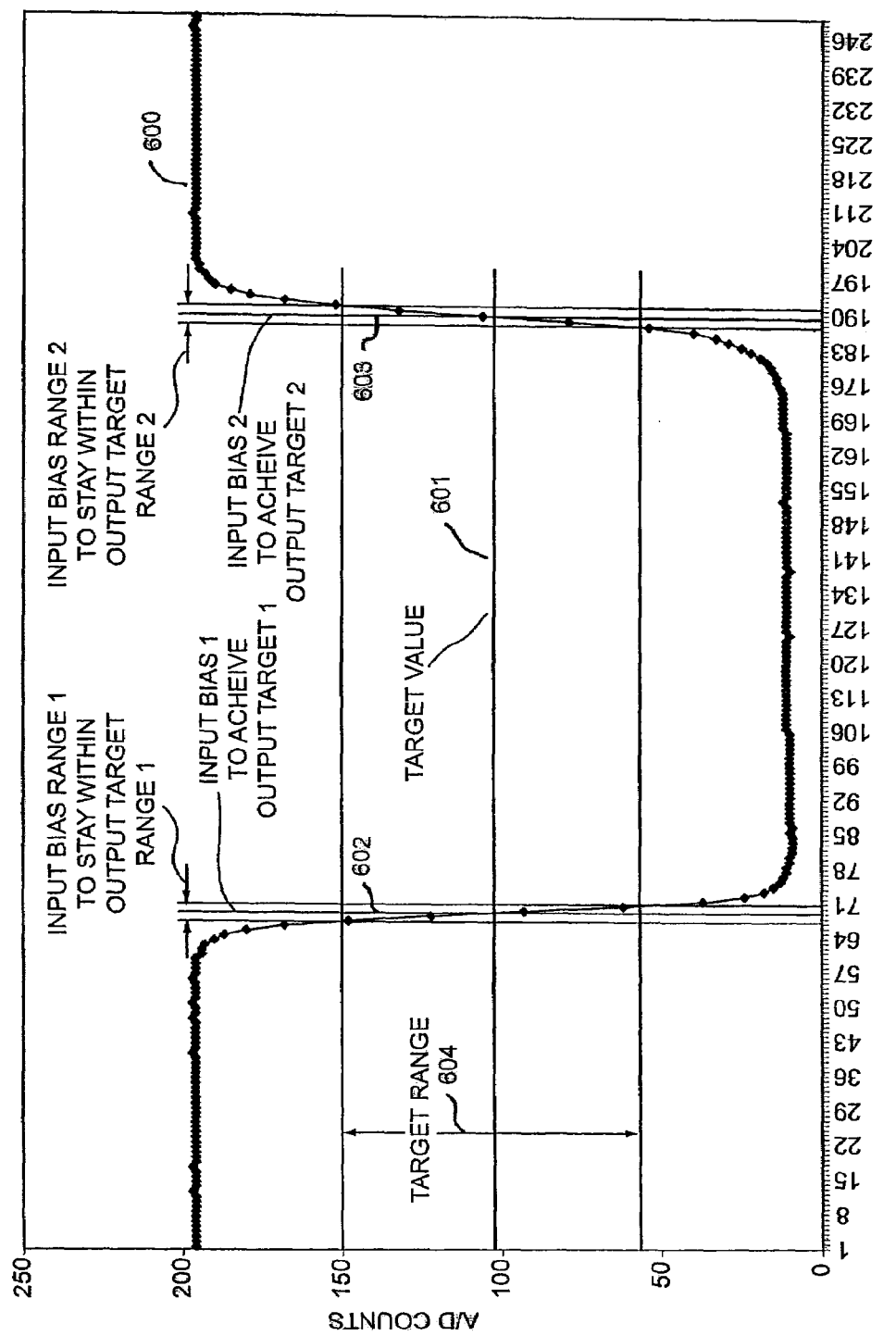
FIG. 10 is a plot of the A/D counts as a function of the bias PWM value for a magnetometer constructed in accordance with the present invention.

In FIG. 10, the total span from approximately 0 to 255 represents the total range of the adjustment to bias. The horizontal line 601 indicates the average of the maximum and minimum A/D values of the curve 600. This is the target A/D value. Vertical lines 602 and 603 are drawn through the points of intersection of curve 600 and line 601 and represent the two possible PWM bias values that correspond to the target A/D value 601. These PWM bias points are used as the initial operating points for subsequent measurements. The bias is set to obtain response within the selected one of the two target ranges and the respective target value is calculated based on the bias setting, the circuit output, and the slope of the output verses bias curve in the target range. Because of the steep slopes in curve 600, it is likely that the target A/D value will lie between the A/D values of the samples taken during the bias sweep. It is desirable to interpolate the Bias PWM value by computing a PWM value for which the resulting A/D measurement would equal the target value. Interpolation is desirable to maintain the symmetry in measurements between the left and right slopes of the curve. A non-symmetrical measurement may accentuate any errors caused by temperature or other internal or external effects. In practice, the error caused by a non-symmetrical measurement may be small enough to be considered insignificant, or a choice may be made for a variety of reasons to reduce the precision of the measurements or subsequent computations and thus introduce small amounts of non-symmetry.

Although the Bias PWM values in FIG. 10 are all positive, the magnetic field generated in the coil due to the PWM can be either positive or negative, with the magnetic null point located in the middle of the trough in the curve. It is perhaps easier to visualize the relationship between a bias and magnetic field by re-scaling the Bias axis to place the zero point in the middle of the trough and considering anything to the left of zero as negative bias and anything to the right as positive bias.

During calibration, the Average A/D value is recorded as well as the PWM Bias values corresponding to this A/D value for each slope of the curve. The points on the curve where the average A/D values lie are called the operating points and are used in subsequent measurements. The distance between the two operating points (called Bias Spread)

is also recorded and used for subsequent measurements. Bias Spread can be considered a constant for purposes of analysis but tests have demonstrated that it is temperature sensitive. Calculation and storage of Bias Spread allows one bias point to be quickly calculated from the other, but the temperature sensitivity suggests that the Bias Spread value be re-calculated periodically to track changes in temperature. This may involve calculation based on the difference in deviation from the Average A/D value or direct measurement when it is determined that the magnetic field is currently not changing.

Going back to the curve in FIG. 10, another value is recorded, and that is the effect that a one-count difference in the Bias PWM Value has on the resulting phase output. This value is the slope of the curve at the operating point. Studies have shown that the slope of the negative-going portion of the curve and the slope of the positive-going portion of the curve are virtually identical, but with opposite sign, therefore, it is necessary only to compute the slope for one portion (for example, the negative-going portion) and simply change the sign for the positive-going portion. For purposes of this discussion, this will hereinafter be called "Bias Slope." To reduce the effect of any non-linearities in the system, this value is recorded from data taken at the optimal operating point established above. Bias slope may be computed from simply the two closest points to the operating point, or may be an average from several points around the operating point if greater accuracy is desired.

In summary, the values that come out of calibration are:
Bias Spread ($S_B$)
Initial Operating Points ($P_{0-}$, $P_{0+}$) (in PWM terms)
Initial A/D values at the Operating Points ($AD_{P0-}$, $AD_{P0+}$)
Initial PWM values at the Operating Points ($PWM_{P0-}$, $PWM_{P0+}$)
Bias Slope Magnitude ($M_B$)

Measurement is the process of setting the proper operating point using the PWM, waiting an amount of time for electrical transients to settle, and taking one or more A/D readings at that operating point. A measurement is taken at each operating point and the results are mathematically combined to yield the final result. Although the dynamic range for this method is limited if the PWM Bias value is fixed, the dynamic movement of the bias allows the dynamic range to be extended an order of magnitude or more over the fixed bias scenario. The measurement process is iterative wherein the bias is moved based on an estimate obtained from the prior measurement, and the A/D conversion results eventually converge to their initial calibrated value for a static magnetic field. Once the A/D result has converged to its calibrated value, the magnetic field may be read directly by subtracting the sum of the PWM values used to obtain the measurement from the sum of the PWM values established during calibration. Since the PWM sets the current through the coil, and thus the magnetic field in the coil, the difference in PWM is a direct measurement of the amount of current necessary to drive the magnetic field in the coil back to its calibrated value, and hence is the difference between the magnetic field at calibration and the present magnetic field.

In a static magnetic field where the A/D results are allowed to converge to their calibrated values, the magnetic field may be measured as stated above by simply using the difference in PWM directly. However, as a compass in a moving vehicle, the magnetic field is hardly static and will seldom converge to a point where using the PWM values alone will suffice. Also, the resolution of the PWM setting may not provide the desired reading resolution. In these cases, adequate accuracy may be obtained by using the current PWM value along with the A/D value for a particular measurement. In this method, the difference between the current A/D measurement and the A/D value at the desired operating point is calculated and then multiplied by the Bias Slope. This will yield a value that can be added to the current PWM value to yield a corrected PWM value which can be used directly as in the static case described above. As long as the A/D values remain in the linear portion or target range 604 of the curve 600, this method will yield results of adequate accuracy. The calculated PWM value can be used during the next measurement as the actual bias point, which causes the convergence in a static magnetic field, or will simply track the magnetic field with a slight lag when the field is changing.

In the case of a large step change in magnetic field, or when the magnetic field changes rapidly enough to drive the A/D values outside the linear portion of the curve, simple logic in the algorithms can suppress the display of the data until the A/D values are once again in the linear area. This iterative method will converge rapidly into the linear area, even when driven far outside, and suppression of displayed data will make these conditions undetectable to the observer.

A measurement at the minimum should include at least two A/D readings at each bias point, spaced in time and averaged to allow AC power line frequency rejection.

If the measurement is taken under the same magnetic conditions that existed when the compass was calibrated, the values representing the ambient magnetic flux in each axis will be very near zero. Placing the compass in a calibrated magnetic field will allow correlation with the absolute standard represented by that field, and will yield a set of scale factors that can be applied to the raw compass readings to yield a result that corresponds to the standard. For purposes of this discussion, however, the raw compass values will suffice since they are directly proportional to the magnetic field and will be represented by the dimensionless variable B.

The first step for measurement is to set the bias point. This is accomplished by simply setting the PWM to the initial operating point values:

$PWM^- = P_0^-$ for negative bias reading and $PWM^+ = P_0^- + M_B$ for positive bias reading Once the PWM has settled to within 1 least significant bit (1 sb) of the A/D converter, the A/D converter is read to obtain the resulting phase representation which will be represented by the variables $AD^-$ and $AD^+$.

Next, the Initial A/D values at the Operating Points ($AD_{P0-}$, $AD_{P0+}$) are subtracted from the current A/D values. This difference is ideally driven toward zero, but a non-zero value simply indicates the amount of PWM adjustment necessary to drive this difference to zero:

$AD_{NULL}^- = AD^- - AD_{P0-}$ and, $AD_{NULL}^+ = AD^+ - AD_{P0+}$

The Nulling A/D terms should be multiplied by the Bias Slope and added to the current PWM values to obtain the PWM values at null. These calculated PWM values are also used as the actual PWM operating points during the next measurement:

$$P_0^- = PWM^- + (AD_{NULL}^- * M_B)$$

and $$P_0^+ = PWM^+ - (AD_{NULL}^+ * M_B)$$

Note the sign change between the two equations. This is necessary because the magnitudes of the slopes at the two bias points may be equal but they have opposite signs. Therefore, the correction should accommodate this.

The final magnetic field value is the difference between the sums of the PWM values obtained during this measurement and the PWM values established during calibration:

$$B = (P_0^- + P_0^+) - (PWM_{P0}^- + PWM_{P0}^+)$$

B is representative of the magnetic field seen by the coil and can be directly correlated with standard magnetic measurement units through the use of scaling factors. Another notable fact is that, since B is a combination of the PWM value used to generate the bias and a phase discriminator output measurement, the need for high resolution on each of these two components is greatly reduced, while still producing a high resolution result.

This measurement method will produce satisfactory measurements as long as the change in the magnetic field to be measured does not exceed the ability of this method to drive the PWM bias value into an acceptable range. In a typical automobile, the rate of change of the magnetic field caused by turning will be well within the range of this method as long as the measurement rate is kept high. Five measurements per second, for example, would adequately cover normal magnetic field changes caused by the vehicle moving within the geomagnetic field.

Figure 8:
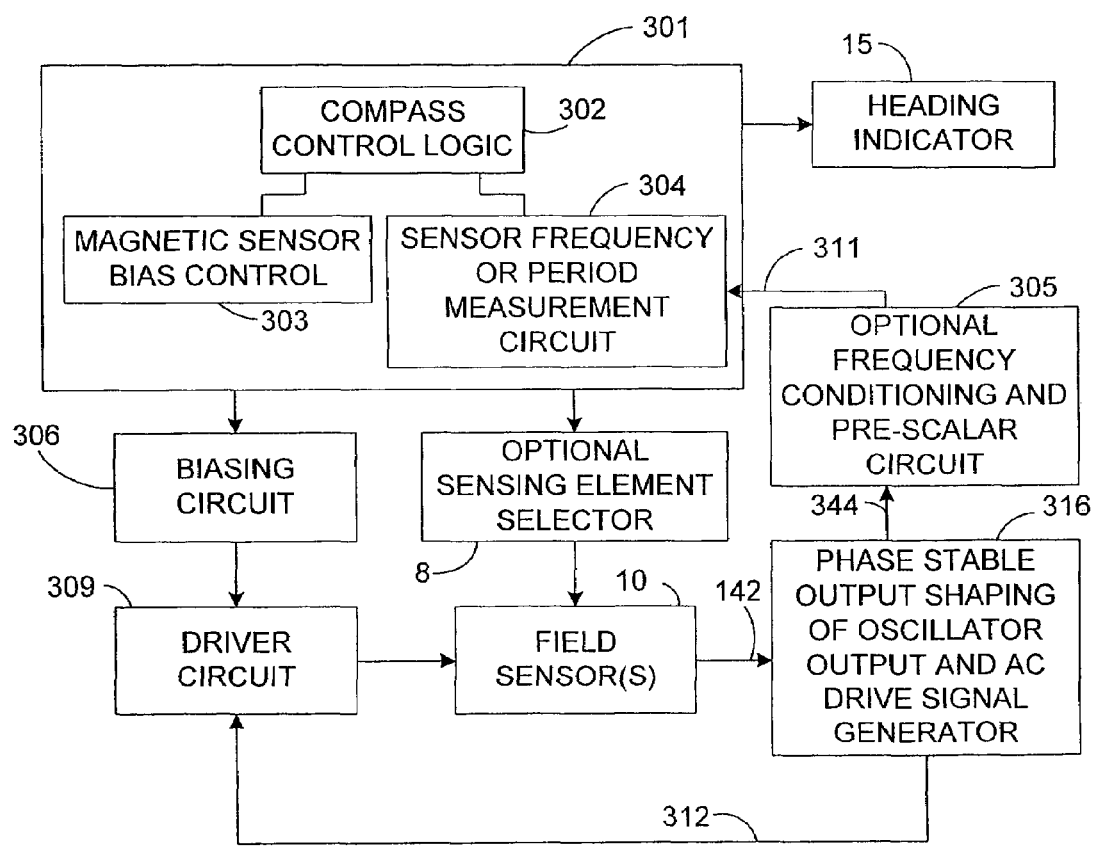
FIG. 8 is an electrical circuit diagram in block form showing a magnetometer constructed in accordance with a second embodiment of the present invention.

FIG. 8 shows a compass system having a magnetometer constructed in accordance with a second embodiment of the present invention. In this embodiment, a microcontroller 301 is provided that includes a compass control logic block 302, a magnetic sensor bias control logic block 303 to determine the bias current setting for a magnetic field sensor(s) 10, and a sensor measurement circuit 304 to determine either the frequency or the period of the response of a selected sensor 10. The microcontroller issues a setting command to a D to A converter of a biasing circuit 306, which may be of any one of a number of types but which is preferably highly repeatable in setting.

The system of the second embodiment preferably has the capability to convert increments of output response frequency to near equivalent increments of bias current and to use them to effectively enhance setting resolution and to obtain good readings without having to set the bias current to the exact values required to establish the targeted measurable state of saturation. Here, the bias current used needs to be known with precision adequate for the measurement to be made, but the bias current used for the measurement and the residual frequency deviation from a targeted frequency value may be used to calculate the bias level which would have directly resulted in operation at the targeted frequency providing some latitude in the bias setting used to make the reading.

Types of D to A converters which may be used in the biasing circuit of this embodiment or the phase output embodiment of FIG. 3 include, but are not limited to, pulse-width modulated types, ladder types, delta sigma types, or ramped capacitor types. Many of the same needs for resolution that were explained for the phase output embodiment apply here as well and in both systems, overall readout speed is increased by decreases in settling time requirements for the D to A converter used for the bias current source. The repeatability, stability, and uniformity of output step size of the D to A converter preferably support the precision attainable by using the output measurements for the respective circuits to calculate the equivalent bias setting. Many of the same techniques described for the phase output embodiment hold here when deviation from a targeted output frequency is used in place of deviation from a reference phase so these details will not be reiterated.

The sensing element selector 8, resonant sensor(s) 10, biasing circuit 306, and driver circuit 309 for FIG. 8 are similar to those components of FIG. 3. Differences include the following. In the phase stable shaping of the oscillator output circuit 316, the oscillator output is clamped and fed back via path 312 to generate an excitation for the resonant circuit which establishes and maintains oscillation at a frequency which achieves a stable phase angle for the response of the resonant circuit relative to this excitation. The shaping circuit 316 also conditions the oscillator signal and feeds it into the frequency counter or period measuring circuit 304. Further, it is preferable that the phase response characteristic of the shaping circuit 316 be such that it maintains oscillation at a frequency close to the resonant frequency of the circuit and in any event that the phase relationship is stably maintained. The responding frequency rather than the phase response of the circuit is read at input 311. It is preferable to acquire a reading of adequate resolution as quickly as is practical. Often it is best to time the period rather than counting output cycles since a period timer may normally operate at or near the clock rate of the microcontroller which is normally several megahertz rather than at the frequency of the oscillator which may, for example, be less than 100 kHz. This has the advantage of accumulating counts which support the required resolution much more rapidly. For timing a period, a pre-scaler circuit 305 may be used, possibly in response to a reset or enable, to output a pulse whose duration is approximately equal to the duration of a preset number of the oscillator cycles. The preset number of cycles is chosen to establish a range in output pulse duration which is convenient for measurement. In this embodiment, as with the other embodiment, features such as the frequency counter, D to A converter, and pre-scaler circuit may be implemented in any one of a number of ways including inclusion in the microcontroller, an application specific integrated circuit, or a discrete circuit.

Figure 9:
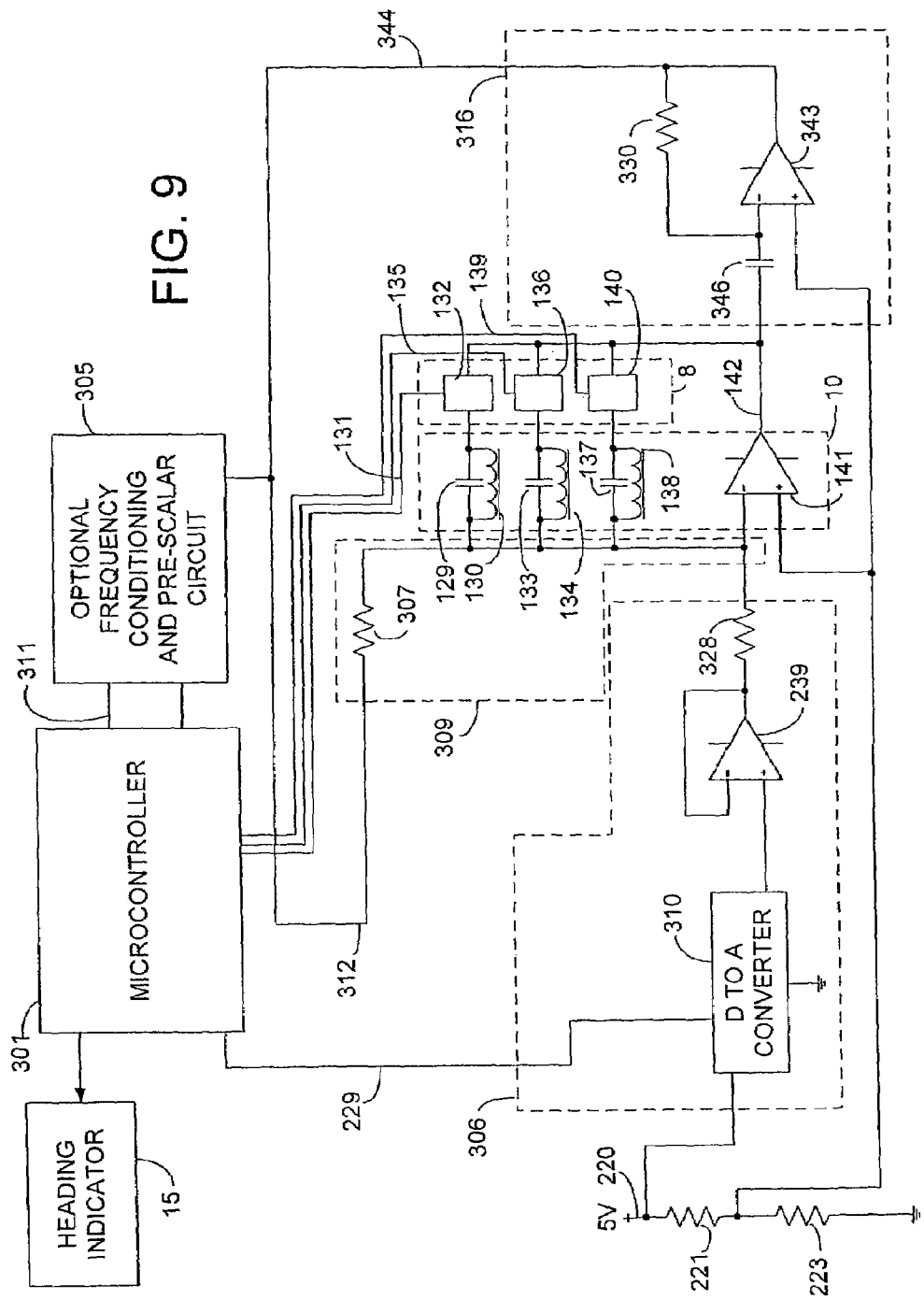
FIG. 9 is an electrical circuit diagram in block and schematic form illustrating one implementation of the magnetometer of the second embodiment.

FIG. 9 is a circuit diagram of an exemplary implementation of the self resonant second embodiment of a magnetometer which has many similarities to the first embodiment implementation of FIG. 4. Components with the same reference numbers have functions which are similar to those of their counterparts in FIG. 4 so their functions will not be described a second time. The primary difference from the circuit of FIG. 4 is that the output 344 of an output shaping and amplitude limiting amplifier 343 of circuit 316 is fed through summing resistor 307 (e.g., 100 kΩ) of driver circuit 309 to the input of the driver amplifier 141 to form an oscillator. The shaping amplifier 343 (e.g., part No. TLC084) is coupled to the output 142 of the driver amplifier 141 by a coupling capacitor 346 (e.g., 1000 pf) and a negative feedback resistor 330 (e.g., 47 kΩ) biases the capacitor 346 so that the duty cycle of the output 344 is averaged to maintain the voltage at the inverting input of amplifier 343. The configuration of the amplifier circuit is chosen so that the oscillator will start oscillation when it is energized and one of the lines 131, 135, or 139 is pulled high by microcontroller 301 to select the LC resonant circuit of sensor(s) 10 to which it is attached. The limiting amplifier is also configured to maintain a stable phase relationship between the oscillator excitation and the oscillator response. This is needed because the circuit responds with very small changes in frequency for small changes in resultant field which it is desirable to detect. With a self resonant device of modest Q, very small changes in the phase relationship between the responding and driving frequency may easily cause frequency shifts of a magnitude which obscure the signal to be measured. The same may be said about loading effects or saturation effects or other nonlinearities of the driver circuit. These are reasons that the careful handling of these circuit features greatly enhance the usable resolution of the magnetometer. Like the first embodiment, divider resistors 221 and 223 are energized by a 5-volt reference supply 220 and maintain 2 volts on the non-inverting input of driver amplifier 141. A preferably stable and repeatable D to A converter 310 of biasing circuit 306 shares the reference supply with the divider and is set to supply the desired bias by microcontroller 301. Buffer amplifier 239 buffers the D to A converter output and supplies bias current to driver amplifier 141 through resistor 328 (e.g., 453 Ω). The value of resistor 307 is chosen so that amplifier 141 stays in its linear range. Pre-scalar circuit 305 is an optional pre-scaler for use when a period timing method is used to determine the frequency oscillation of the circuit.

Several features of the invention which are implemented in the circuits of FIGS. 4 and 9 are as follows. Since the resonant LC circuit is in the feedback path of a high performance operational amplifier (141), the summed input signals from summing resistors 128/328 and 244/307 are accurately sourced to the parallel LC circuit in a current source mode. Another way of saying this is that the equivalent source impedance of the resonant circuit driver is very high. This is a nearly ideal way to drive a parallel resonant circuit without loading it significantly, thus allowing it to respond accurately as a resonant element. It is also a good way to accurately and repeatably sum the DC bias and the AC drive signals and source them to the circuit. Since the resonating capacitor blocks DC current, substantially all of the sourced bias current flows through the selected field sensing inductor as desired. Additional, well-behaved loads on the amplifier 141 have almost no effect on the drive signal supplied to the resonant circuit so the output of the driving amplifier is an excellent place to couple the oscillator response monitoring circuit to the resonant circuit response. The fact that the DC bias current path is naturally through the field sensing inductive element for the parallel resonant configuration is also a factor in choosing a parallel as opposed to a series resonant configuration. The Q of the LC circuit is desirably high but size and economic constraints make it desirable to work with a modest Q. The inductance change and the resulting change in resonant frequency are very small for the small changes in magnetic field that it is desired to measure. Small instabilities in phase angle detection by the phase detector can easily cause frequency instability for the circuit of FIG. 9 and phase readout errors for the circuit of FIG. 4 which will mask the underlying inductance changes due to fields to be measured so that the phase detector should have excellent sensitivity and short term stability for phase detection. For these reasons, the phase detector is preferably configured from a high quality comparator, operational amplifier, or other high gain amplifier. Unlike most resonant circuits which are driven to a point where some form of saturation or clipping occurs to ultimately limit the amplitude of response, in the circuits of FIGS. 4 and 9, the amplitude or magnitude of resonance exciting drive signal is limited so that the natural losses due to the Q of the resonant circuit preferably limit resonant circuit response so that it remains in the linear, non-saturating, non-clipping range of the driving amplifier.

The simplified circuit diagrams of FIGS. 4 and 9 do not detail such things as power supplies, power and ground connections, and bypass capacitors for integrated circuit devices. In each circuit, a stable power supply with a supply voltage of 5 volts, for example, is assumed. Since there is partial cancellation of some of the effects when the two bias settings are averaged to attain the final reading, it is desirable to have a power supply of especially high short term stability to cover the duration of the sequence of readings used to determine individual field strength values. Optionally, a separate reference supply may be used to energize the voltage sensitive portions of the circuit. It is assumed that one skilled in the art will refer to component data sheets for such details as device pin assignments and the connection of the emitter of the output stage of the comparator 215 to circuit ground. It is also assumed that proper bypass capacitors will be added and that needed electrostatic discharge (ESD) protection and other details of design will be properly handled. A suitable power supply for use in vehicles having higher voltage (e.g., 24 volts or more) batteries is disclosed in commonly-assigned U.S. Pat. No. 6,262,831, the entire disclosure of which is incorporated herein by reference.

Figure 5:
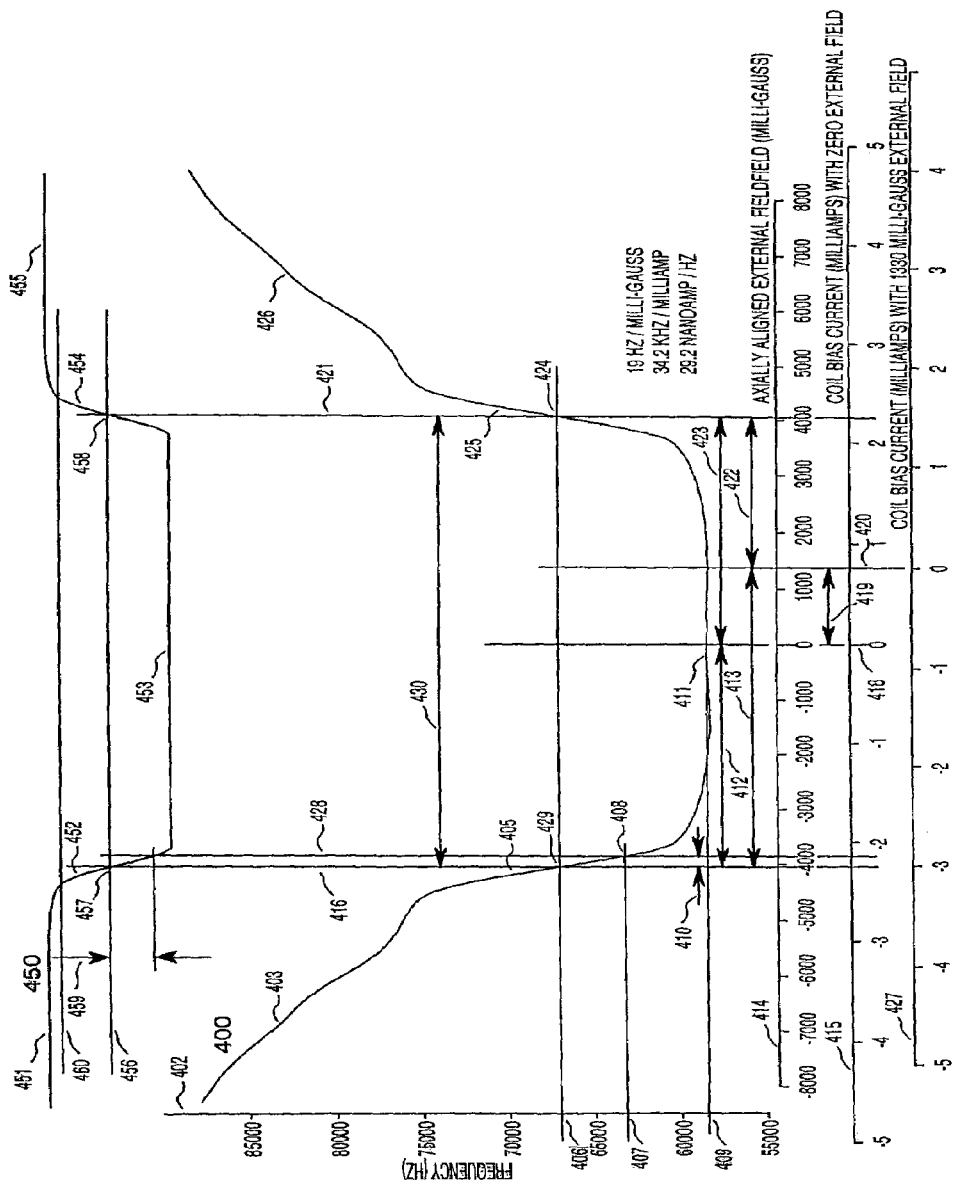
FIG. 5 is a plot of frequency versus current of a sensor that may be used in the present invention.
Figure 6:
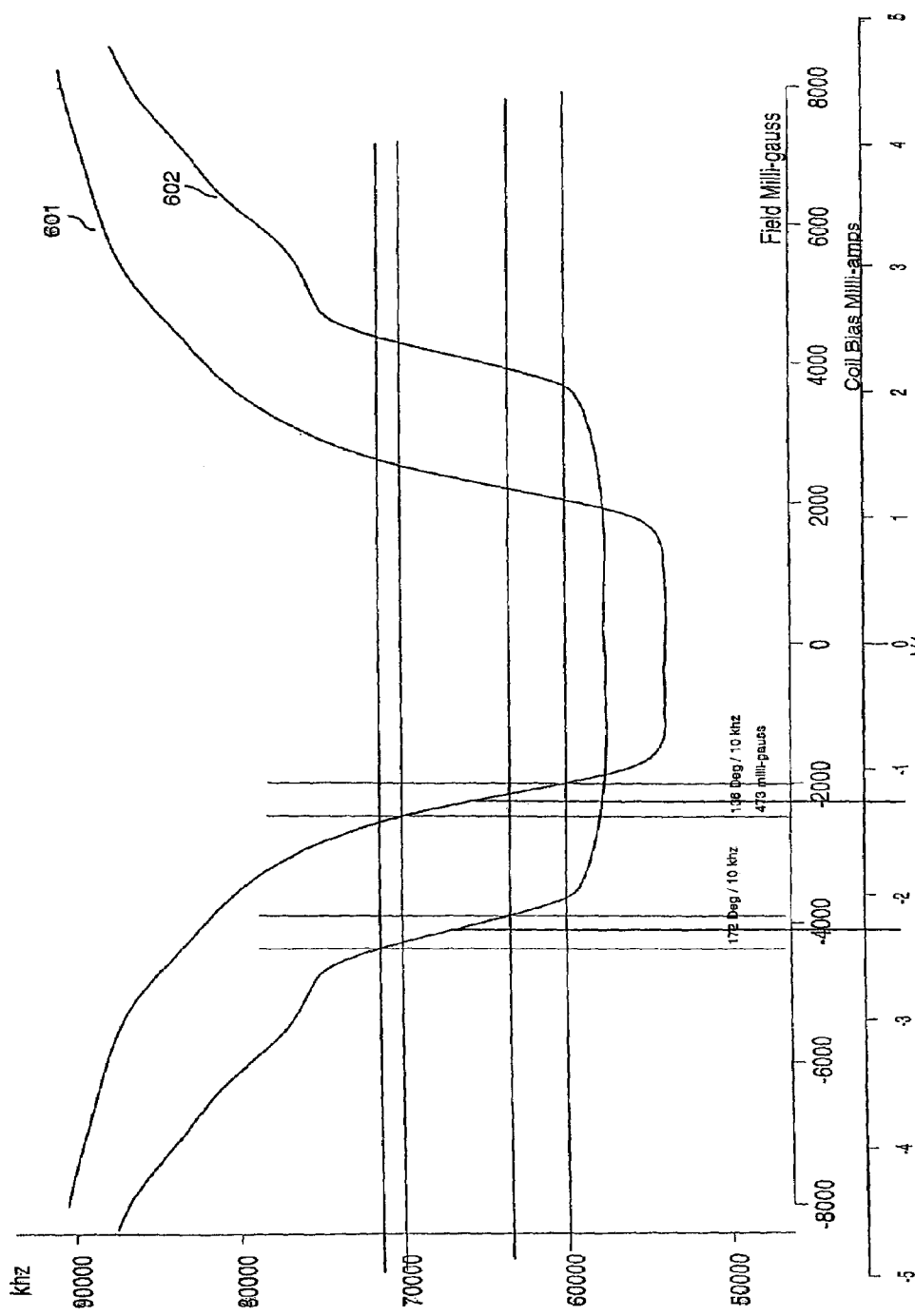
FIG. 6 is a plot of frequency versus current for two different sensors that may be used with the present invention.

In FIG. 5, curve 400 is the resonant frequency response of a parallel LC circuit to a bias current and/or an equivalent axially aligned external field. A resonant drive circuit similar to that of FIG. 9 was used to generate the data on which the curve is based. Curve 450 indicates the relative phase response of a similar LC circuit driven at a constant frequency of approximately 67 kHz and subjected to the external field and/or bias as shown. Horizontal axis 414 indicates the axially aligned component of the external field which causes the indicated response of the LC circuit with zero bias. Horizontal axis 415 indicates the coil bias current which causes the indicated response when the field sensing coil is placed in an external field of zero field strength in the axially aligned direction. The conversion constant of approximately 1800 milli-gauss/milliamp is analogous to the constant to convert bias current to equivalent field strength referred to in the description of FIG. 3 and applies to the LC combination on which the data of FIG. 5 was taken. The values indicated on axis 415 when multiplied by this constant approximately equal the milli-gauss values on axis 414. The values on axis 427 indicate the bias current which causes the indicated response when the coil is in an external field having an axially aligned field strength of approximately 1330 milli-gauss.

The curve 400 has a section 411 in the middle for which the resonant frequency is lowest indicating the highest inductance. This is bounded by two symmetrical portions 405 and 425 where the frequency change with variation in field strength or bias current is greatest and also where it has the highest linearity. The line 406 which is approximately centered in the high slope regions of the curve intersecting it at points 424 and 429 is a preferred operating level as will be explained in more detail later. In generally symmetric portions 403 and 426 of the curve, the core is forced into deeper saturation and the curve of resonant frequency verses field or bias level is of lower slope and more non-linear.

For operation of the frequency based circuit of FIG. 9, a target frequency of 67 kHz for example, as indicated by line 406, is selected by the microcontroller program and the bias current is then adjusted to approach operation at one of the two points 429 or 424 say, for example, point 429. Preferably, the process starts with the bias established from the previous measurement where point 429 was approached, then, if necessary, several successive bias currents may be tried to come successively closer to the 67 kHz frequency at point 429. If an expected value is not available for an initial bias setting, it is preferable to begin close to zero bias and search for the region 411 of low resonant frequency since there is only one such region as opposed to two regions 403 and 426 of higher resonant frequency. Knowing that one is in region 411, a reduction in the bias current will approach point 429 and an increase will approach point 424. In the previous sentence, the words indicating direction refer to signed value rather than magnitude. As the targeted operating point 429 is approached, the result, for example, may be the point 408 for which a bias setting is made and the frequency 407 measured. Note here that normally the criteria would call for approximations which would bring one closer to point 429, but the point 408 is convenient for illustrative purposes. Also note that the measured slope of the curve 405 may be used to calculate the bias adjustment which is needed to reduce the number of iterations required to come close to the targeted operating point. The bias current which causes the targeted frequency response is used in subsequent calculations. If the mechanism to set bias current has the required resolution, the bias current which causes the targeted frequency response may be set and the frequency response verified but it is generally preferable to use the frequency response measured at a bias setting which is close and to use the measured or predetermined slope of the frequency versus bias current curve to extrapolate from the point or points at which the bias was measured to calculate the bias at the targeted frequency. Point 408 is in a reasonably linear region 405 of the curve 400 and it is presumed that the slope of this portion of the curve has been predetermined or measured and recorded by the microcontroller. The microcontroller uses the difference between the measured frequency for point 408 and the target frequency at 406 along with the slope of curve 405 to calculate the signed length of increment 410. This length, which has a negative sign in the illustration, is added to the bias current at point 408 to approximately predict the bias 416 which would cause the coil to operate at point 429 at its 67 kHz target frequency at 406. An optional method of practicing the invention is to use measurements of frequency at more than one bias setting and to use any of a number of interpolation or extrapolation techniques to calculate the bias which yields the targeted output frequency.

Next, it is preferable to measure the bias current required to operate at point 424 which is the other point of operation at the 67 kHz operating frequency. The difference in bias current as indicated by the distance 430 from point 429 to point 424 should remain nearly constant but may be somewhat temperature dependent and is preferably recorded by the microcontroller and updated periodically so that shifts such as those which may be caused by temperature will be tracked. This signed value may be added to the bias just measured for point 429 to determine the bias current to first try in the sequence to determine the operating bias at point 424. Then, the same trial sequence and the same calculation of an increment in bias current, which will compensate for the difference between the measured and the targeted frequency as was used to measure the operating bias for point 429, is preferably used to determine the operating bias for point 424. Here, the slope of the curve at 425 is the negative of the slope of the curve at 405.

Next, it is preferable to compute the average of the signed bias current values measured at points 429 and 424. This will be referred to as the average bias measurement. As will be explained, the field which would be produced by the average bias measurement is approximately equal to the field which when summed with the axially aligned component of the external field results in a near zero flux value. In other words, the value of the axially aligned component of the external field is approximately equal to the negative of the average bias measurement multiplied by the conversion constant to convert bias current to equivalent field strength. Here, the constant to convert bias current to equivalent field strength is the one which approximately equates coil bias current to equivalent axially aligned field strength.

As a first illustration, when the axially aligned component of the external field is zero, bias scale 415 applies and the negative of one-half of the sum of signed distances 423 and 412 from 0 at 418 times the conversion from bias to equivalent flux is approximately 0.

As a second illustration, consider the case where the axially aligned component of the external field is approximately 1330 milli-gauss. In this case, the resultant field in the inductor is 1330 milli-gauss when the bias current is zero so the bias scale 427 which is shifted to read 0 at the point of 1330 milli-gauss on the scale is the appropriate one to use. Then reading from this shifted scale, the average bias current measurement is equal to half of the sum of the positive reading 422 read from the abscissa of line 420 to the abscissa of line 421 and the negative reading 413 read from the abscissa of line 420 to the abscissa of line 416. For the symmetric curve 400, the average bias reading so computed is approximately equal to the negative of the distance 419 from the abscissa of line 420 to the abscissa of line 418. This bias current when converted from bias current to equivalent field strength is the negative of the 1330 milli-gauss axially aligned component of the external field in which the coil is placed. This is the negative of the value of the field strength to be measured.

The slope of output resonant frequency versus bias current may be measured in the vicinity of either point 429 or point 424 by taking a measurement of frequency, stepping the bias in a known direction, and taking another frequency measurement and noting the sign of the slope of the resonant frequency versus bias. If the slope is negative, the readings are in the vicinity of point 429 and, if the slope is positive, the readings are in the vicinity of point 424. This is one method which may be used as part of the present invention to determine the specific one of the two targeted operating points which is closest to the bias current level to which the coil is being driven and thus to determine to which of the two points the measurement values are to be attributed.

Curve 450 indicates the general phase response of a circuit such as that in FIG. 4 when operated with a field sensing inductor similar to the one of FIG. 9 used for the frequency response plot of curve 400. Many of the conditions of operation between the circuits on which the plots 400 and 450 are similar except that in the plot 400, the phase detecting output is used to supply the exciting frequency to maintain the phase of the excitation relative to the phase of the response at a near constant value which is preferably very close to the phase for the resonant condition of the LC circuit. As explained above in the detailed discussion of curve 400, the nominal 67 kHz frequency represented by line 406 and resonant operating points 429 and 424 was a good choice for a target frequency to use for field intensity measurements. In the circuit of FIG. 4 on which the plot 450 is based, the circuit driving the LC sensor combination is functionally similar to that of FIG. 9 except for several things. First, the phase detector output is not used to generate the exciting frequency to drive the coil but instead is fed into a phase discriminator and a mechanism is provided to read the phase of the output response relative to the phase of the driving frequency. Next, the 67 kHz driving frequency chosen by many of the same criteria used to choose it as the target frequency for operation of the resonant circuit of curve 400 is selected as a nearly constant frequency with which to drive the circuit on which the curve 450 is based. The curve 450 is then representative of the output of FIGS. 3 and 4.

Some general tolerance and design considerations for construction and operation of the circuit will be given. It is preferable to select the reference phase output value so that it is approximately equal to the phase output when the LC circuit is oscillating in its resonant condition. This is preferable because among other things, the output phase is normally least effected by changes in Q when the resonant circuit operation is close to its resonant frequency. Another issue that may affect the selection particularly of the operating frequency and the reference phase is that the effects of hysteresis on the fidelity with which operating portions of the curves are retraced vary with the operating portions which are selected, with the target frequency chosen for the frequency version of the circuit, and with the driving frequency and the target phase chosen for the phase circuit and also with the sequence of bias settings used for preconditioning the core and for taking readings and with the core material and for the annealing process used for the particular core material. The effects of hysteresis may be assessed and appropriate adjustments made for satisfactory operation. High resolution plots of output levels from the circuits in response to retraced sequences of varying bias or field level are useful parts of such evaluations.

The general shape of the curves 450 and 400 are similar with regions 451, 452, 453, 454 and 455 of curve 450 corresponding, respectively, to regions 403, 405, 411, 425 and 426 of curve 400. The reference phase output 456 corresponds to the targeted output frequency 406 and operating points 457 and 458 correspond to 429 and 424, respectively. The general operational procedure for use of the circuit having the representative phase output of curve 400 is to locate operating bias points which create phase outputs very close to the reference phase output values shown at points 457 and 458 and to, through calculation or direct verification, determine the bias levels required to operate at the target phase output level 456. The calculation may optionally use pre-measured phase versus bias current slopes or direct interpolation or extrapolation or possibly other methods to determine the bias current which produces the reference phase response. The points 457 and 458 are at the two points of intersection of curve 450 with line 456. This leads to location of target bias values at 416 and 421 which are nearly identical to the bias values located for the target output frequency for curve 400. Practically all of the methods discussed to determine the bias values which cause the circuit to operate at its targeted output frequency apply directly to the phase output version of the circuit when output phase is substituted for direct or implied references to output frequency and when corresponding points or regions on curve 450 are substituted for points or regions on curve 400. These directly analogous features and methods are considered to be part of the overall invention. One difference in the overall characteristics of curve 450 versus 400 is in the flat portions 451 and 455 of the phase response curve which, in some embodiments, may fold back at extremes of the curve. In the algorithms, care should be used to locate various regions such as the region 453 of the curve without mistaking portions 451 or 455 for it. One optional method to simplify the problem is to by design assure that the fold back will not fall below line 460, for example, and to for purposes of analysis, substitute all output phase readings which exceed the limiting value representative of the line 460 with the value so represented. Then, this limiting value is easy to test for and unexpected slope variations of the curve in these regions will not add complication in the ensuing calculations. Any algorithms for the frequency version of the circuit which depended on the negative slope of the curve in region 403 or the positive slope of the curve in region 426 must usually be modified for application to the phase output version because this information is not generally available for curve 450. Viewed from another perspective, the complex shape of portions 403 and 426 of curve 400 may complicate analysis, especially that to determine the desirable linear portion, so having the relatively flat response for the corresponding portions of curve 450 is an advantage in some embodiments.

The voltage across resistor 128/328 of FIGS. 4 and 9 determines the bias current for the sensor. As indicated in examples, a precise bias setting was desired to obtain the desired field measurement precision and bias currents of several milliamps were also desired. Some prior art circuits connect a bias generating resistor to an analog switch or other electronic switching element in such a way that the resistance of the switch becomes part of the resistance which determines the bias current. The configuration of the preferred embodiments is such that the bias current is substantially independent of the resistance of any electronic switch which carries an appreciable portion of the bias current and, thus, also independent of matching of such elements. The preferred embodiments provide a bias current which is substantially equal to the current through respective resistors 128 and 328 for each of the example circuits. In each, resistor 128/328 is connected between sensing nodes of high gain amplifiers which in turn control the bias current determining voltage drop across the resistor. In each circuit, for a given measurement, the bias current flows through only one of the analog switches 132, 136, or 140 and the current carrying switch is not in the path which determines the voltage across resistor 128/328. The current carrying switch is also in the path which is substantially current sourcing or in other terms of high source impedance so that the normal range of switch resistance has a minimal effect on the resonant response of the resonant member of the circuit. Furthermore, at higher temperatures, the resistance of typical low cost analog switches may be greater than 100 ohms so that even for one switch in the path, a significant part of the nominal plus and minus one and one-half volt operating range of the operational amplifier is used to supply the voltage drop across even the single analog switch. Having only one analog switch in the active bias current carrying path is beneficial. Since one side of the sensing coils are connected together, for N coils, only N+1 conductors are required to configure the grouped sensing coils into the circuit which may be placed at a position which is remote to the coils.

As disclosed herein, a processor for the inventive compass circuits includes a microcontroller that receives the readings from the magnetometer and computes the vehicle heading that is relayed to a heading indicator. It will be appreciated by those skilled in the art that the compass processor may be configured of any form of logic circuit including, but not limited to, a microprocessor, a programmed logic array, or various discrete logic components. Additionally, the processing circuit may include more than one processor or microcontroller. For example, the microcontroller illustrated in the drawings may be utilized to control the magnetometer and otherwise provide scaled readings from the sensors from the magnetometer to a second processor that in turn computes the vehicle heading.

Regardless of the construction, the compass processor preferably is capable of automatically and continuously calibrating itself so as to account for field disturbances caused by the vehicle itself and by objects external to the vehicle. The particular automatic calibrating algorithm to be used with the magnetometer of the present invention is not critical. Virtually any automatic calibrating routine may be utilized. Examples of suitable automatic calibration algorithms are disclosed in U.S. Pat. Nos. 4,807,462, 4,953,305, 5,737,226, 5,761,094, 5,878,370, 6,047,237, and 6,192,315.

A magnetometer constructed in accordance with the present invention may be constructed at low cost while still attaining a dynamic range of ±3–5 gauss at a resolution of 1 milli-gauss which is better than magnetometers currently used in commercially available electronic compasses for use in a vehicle. Such conventional magnetometers have a range of about ±3–3.5 and a resolution of 3.5–5 milli-gauss.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A magnetometer comprising:
   a resonant sensor for sensing a magnetic field, said sensor generating an output signal having a signal characteristic that varies in response to the sensed magnetic field and in response to an applied bias;
   a biasing circuit for adjustably biasing said sensor at two or more bias levels; and
   a processor coupled to receive the output signal from said sensor, said processor determines the magnetic field component sensed by said sensor,
   wherein the peak to peak excursion of the magnetic field level in said resonant sensor during a resonant cycle is a fraction of the field level excursion range due to the adjustment of the bias circuit over its total range of adjustment.

2. The magnetometer of claim 1, wherein said biasing circuit dynamically biases said sensor in response to a bias setting applied by said processor and said processor determines the magnetic field component sensed by said sensor as a function of the bias setting applied to said sensor.

3. The magnetometer of claim 1, wherein the peak to peak excursion of the magnetic field level in said resonant sensor during a resonant cycle is less than one-half of the field level excursion range due to the adjustment of the bias circuit over its total range of adjustment.

4. The magnetometer of claim 1, wherein the peak to peak excursion of the magnetic field level in said resonant sensor during a resonant cycle is less than one-fourth of the field level excursion range due to the adjustment of the bias circuit over its total range of adjustment.

5. A magnetometer comprising:
   a resonant sensor for sensing a magnetic field, said sensor generating an output signal having a signal characteristic that varies in response to the sensed magnetic field; and
   a processor coupled to receive the output signal from said sensor, said processor determines the magnetic field component sensed by said sensor,
   wherein the peak to peak excursion of the magnetic field level in said resonant sensor during a resonant cycle is less than the total range of the magnetic field to be measured.

6. The magnetometer of claim 5, wherein the peak to peak excursion of the magnetic field level in said resonant sensor during a resonant cycle is less than one-half of the total range of the magnetic field to be measured.

7. The magnetometer of claim 5 and further including a biasing circuit for dynamically biasing said resonant sensor in response to a bias setting applied by said processor and said processor determines the magnetic field component sensed by said sensor as a function of the bias setting applied to said sensor.

8. The magnetometer of claim 7, wherein said processor is operable to generate the bias setting and thereby control said biasing circuit to dynamically bias said sensor such that the signal characteristic of the output signal is maintained within a relatively small target range of levels.

9. The magnetometer of claim 8, wherein said processor determines the magnetic field component sensed by said sensor as a function of both the bias setting applied to said sensor and the level of the output signal in the target range to enhance the resolution of the reading.

10. The magnetometer of claim 7, wherein the peak to peak excursion of the magnetic field level in said resonant sensor during a resonant cycle is less than one-fourth of the field level excursion range due to the adjustment of the bias circuit over its total range of adjustment.

11. The magnetometer of claim 7, wherein said sensor comprises a first sensing element having a sensor characteristic that varies in response to a magnetic field, and a second sensing element having a sensor characteristic that varies in response to a magnetic field,
   wherein said biasing circuit adjustably biases said first sensing element to at least a first bias level and a second bias level, and for adjustably biasing said second sensing element to at least a third bias level and a fourth bias level, and
   wherein said processor is coupled to said first and second sensing elements to receive the output signals from said sensing elements, said processor measures the magnetic field components sensed by said sensing elements by sequentially:
   sampling the output signal of said first sensing element at the first bias level,
   sampling the output signal of said second sensing element at the third bias level,
   sampling the output signal of said second sensing element at the fourth bias level,
   sampling the output signal of said first sensing element at the second bias level,
   determining the magnetic field component of said first sensing element as a function of the samples taken at the first and second bias levels, and
   determining the magnetic field component of said second sensing element as a function of the samples taken at the third and fourth bias levels.

12. The magnetometer of claim 11 and further comprising a third sensing element having a sensor characteristic that varies in response to a magnetic field, wherein:
   said biasing circuit adjustably biases said third sensing element to at least a fifth bias level and a sixth bias level; and said processor is further coupled to receive the output signal from said third sensing element, said processor measures the magnetic field components sensed by said sensing elements by sequentially:
sampling the output signal of said first sensing element at the first bias level,
sampling the output signal of said second sensing element at the third bias level,
sampling the output signal of said third sensing element at the fifth bias level,
sampling the output signal of said third sensing element at the sixth bias level,
sampling the output signal of said second sensing element at the fourth bias level,
sampling the output signal of said first sensing element at the second bias level,
determining the magnetic field component of said first sensing element as a function of the samples taken at the first and second bias levels,
determining the magnetic field component of said second sensing element as a function of the samples taken at the third and fourth bias levels, and
determining the magnetic field component of said third sensing element as a function of the samples taken at the fifth and sixth bias levels.

13. The magnetometer of claim 7, wherein said sensor comprises a first sensing element having a sensor characteristic that varies in response to a magnetic field, and a second sensing element having a sensor characteristic that varies in response to a magnetic field,
the magnetometer further comprising at least one analog switch provided for selecting said first or second sensing element, said at least one analog switch having a resistance,
wherein said biasing circuit supplies a biasing current to a selected one of said sensing elements, and said processor is coupled to receive output signals from a selected one of said first and second sensing elements and is coupled to said at least one analog switch to select one of said first and second sensing elements,
wherein said biasing circuit is configured to supply a biasing current that is substantially independent of the resistance of said at least one analog switch over a range of operation.

14. The magnetometer of claim 7, wherein said sensor comprises a first sensing element having a sensor characteristic that varies in response to a magnetic field, and a second sensing element having a sensor characteristic that varies in response to a magnetic field,
the magnetometer further comprising at least one analog switch provided for selecting said first or second sensing element,
wherein said biasing circuit adjustably biases said sensing elements to at least a first bias level and a second bias level, said processor is coupled to receive output signals from a selected one of said first and second sensing elements and is coupled to said at least one analog switch to select one of said first and second sensing elements,
wherein said biasing circuit biases one of said sensing elements at the first bias level and subsequently biases the same sensing element at the second bias level without any analog switch changing states.

15. The magnetometer of claim 7, wherein the bias setting selected to determine the magnetic field component is based on the difference in bias current at two points for which the output signal achieves a target response.

16. The magnetometer of claim 7, wherein the bias setting selected to determine the magnetic field component is based on no more than five prior raw readings obtained from said sensor.

17. The magnetometer of claim 7, wherein the bias setting serves to approximately balance the field to be measured in each of two target ranges of sensor response.

18. The magnetometer of claim 7, wherein the bias setting is selected to bring the output signal of said sensor within the target range for one of two different ranges where a targeted response value may be attained.

19. The magnetometer of claim 18, wherein the bias setting is subsequently selected to bring the output signal of said sensor within a second target range corresponding to the other one of the two different ranges where a targeted response value may be attained.

20. The magnetometer of claim 7, wherein said processor measures the output signal response and determines the bias needed to achieve a target response value based upon the present bias setting and the output signal response.

21. The magnetometer of claim 7, wherein said processor determines the magnetic field component sensed by said sensor as a function of two bias settings for which at least one targeted response value may be attained.

22. The magnetometer of claim 7 and further comprising a multiple pole filter coupled to an output of said biasing circuit for filtering the bias to be applied to said sensor.

23. The magnetometer of claim 7, wherein said processor controls said biasing circuit to dynamically bias said sensor such that the signal characteristic of the output signal is maintained in one of two target ranges.

24. The magnetometer of claim 23, wherein said processor determines in which of the two target ranges the signal characteristic of the output signal falls based upon the sign of the slope of the plot of the bias setting versus output signal characteristic.

25. The magnetometer of claim 23, wherein the total range through which said sensor may be biased by said biasing circuit approximately spans the range required for biasing said sensor to have output signal characteristics falling within both of the two target ranges plus the range required for sensing external magnetic field intensities to be measured.

26. The magnetometer of claim 7, wherein said biasing circuit comprises a pulse-width modulated digital-to-analog converter for setting a bias current for said sensor, said digital-to-analog converter having an accuracy that is substantially greater than its incremental resolution.

27. The magnetometer of claim 7, wherein said processor uses the bias setting signal for a measurement from said sensor that is based on a previous reading from said sensor.

28. The magnetometer of claim 7, wherein said processor initiates a search sequence to find the bias setting for which a target response may be determined.

29. The magnetometer of claim 5, wherein the signal characteristic is the phase of the output signal.

30. The magnetometer of claim 5, wherein the signal characteristic is the frequency of the output signal.

31. The magnetometer of claim 5, wherein said sensor has an inductance that varies as a function of the strength of the sensed magnetic field.

32. The magnetometer of claim 5, and further comprising a phase discrimination circuit coupled between said sensor and said processor.

33. The magnetometer of claim 5 and further comprising an excitation circuit coupled to said resonant sensor for supplying an excitation signal thereto.

34. The magnetometer of claim 5, wherein said processor filters measurements from said sensor to reject a cyclically varying magnetic field generated by current flowing through AC power lines.

35. The magnetometer of claim 5, wherein said sensor constitutes a first sensor for sensing a first component of a magnetic field, said magnetometer further comprising:
- a second sensor for sensing a second component of the magnetic field, each of said sensors generating an output signal having a frequency that varies in response to the sensed component magnetic field and in response to an applied bias current; and
- a biasing circuit for generating bias currents to dynamically bias said first and second sensors, wherein said processor is coupled to receive the output signals from said sensors and coupled to said biasing circuit, said processor operable to control said biasing circuit to dynamically vary said bias currents applied to said sensors such that the frequency of the output signals is maintained within one or more target frequency ranges, said processor determines the magnetic field components sensed by said sensors as a function of the biasing currents applied to said sensors.

36. The magnetometer of claim 5, wherein said sensor generates an output signal having a characteristic that varies substantially linearly in response to the sensed magnetic field components throughout a first range of magnetic field levels, wherein the magnetic field component varies throughout a second range of magnetic field levels, the magnetometer further comprises:
- a magnetic field generating mechanism for generating a magnetic field that is summed with any external magnetic field such that the resultant magnetic field is sensed by said sensor, the strength of the generated magnetic field being selectively variable,
- wherein said processor is coupled to said magnetic field generating mechanism, said processor operable to control said magnetic field generating mechanism to select the field strength of the generated magnetic field and thereby dynamically shift and/or maintain the second range within the first range.

37. An electronic compass for a vehicle comprising the magnetometer defined in claim 5 and further comprising:
- a second sensor for sensing a second component of the magnetic field, the second component being orthogonal to the first component as sensed by the other sensor;
- a processing circuit for computing a vehicle heading as a function of the magnetic field components determined by said magnetometer; and
- a heading indicator coupled to said processing circuit for indicating the vehicle heading.

38. The magnetometer of claim 5, wherein said sensor comprises a first sensing element having a sensor characteristic that varies in response to a magnetic field, and a second sensing element having a sensor characteristic that varies in response to a magnetic field;
- a single first analog switch provided for selecting said first sensing element;
- a single second analog switch provided for selecting said second sensing element; and
- a processor coupled to receive output signals from a selected one of said first and second sensing elements and coupled to said first and second analog switches to select one of said first and second sensing elements.

39. An electronic compass for a vehicle comprising:
- a resonant sensor for sensing a magnetic field, said sensor generating an output signal having a signal characteristic that varies in response to the sensed magnetic field; and
- a processor coupled to receive the output signal from said sensor, said processor determines the magnetic field component sensed by said sensor; and
- a heading indicator coupled to said processor for indicating the vehicle heading,
- wherein the peak to peak excursion of the magnetic field level in said resonant sensor during a resonant cycle is less than the total range of the magnetic field to be measured.

40. The electronic compass of claim 39, wherein the peak to peak excursion of the magnetic field level in said resonant sensor during a resonant cycle is less than one-half of the total range of the magnetic field to be measured.

41. The electronic compass of claim 39 and further including a biasing circuit for dynamically biasing said resonant sensor in response to a bias setting applied by said processor and said processor determines the magnetic field component sensed by said sensor as a function of the bias setting applied to said sensor.

* * * * *